US012652040B2

(12) United States Patent
Kobayashi

(10) Patent No.: US 12,652,040 B2
(45) Date of Patent: Jun. 9, 2026

(54) DIP INJECTION FOR GATE DRIVERS

(71) Applicant: Renesas Electronics Corporation, Tokyo (JP)

(72) Inventor: Daisuke Kobayashi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 225 days.

(21) Appl. No.: 18/504,701

(22) Filed: Nov. 8, 2023

(65) Prior Publication Data

US 2024/0356541 A1      Oct. 24, 2024

Related U.S. Application Data

(60) Provisional application No. 63/460,476, filed on Apr. 19, 2023.

(51) Int. Cl.
| | |
|---|---|
| *H03K 17/16* | (2006.01) |
| *H02M 1/00* | (2007.01) |
| *H02M 1/088* | (2006.01) |
| *H02M 1/44* | (2007.01) |
| *H02M 3/158* | (2006.01) |

(52) U.S. Cl.
CPC ........ *H03K 17/165* (2013.01); *H02M 1/0054* (2021.05); *H02M 1/088* (2013.01); *H02M 1/44* (2013.01); *H02M 3/158* (2013.01)

(58) Field of Classification Search
CPC .. H03K 17/165; H02M 1/0054; H02M 1/088; H02M 1/44; H02M 3/158; H02M 1/0009; H02M 1/08
See application file for complete search history.

(56) References Cited

U.S. PATENT DOCUMENTS

2018/0062633 A1*   3/2018  Nomura .................. H02M 1/08

* cited by examiner

*Primary Examiner* — Metasebia T Retebo
(74) *Attorney, Agent, or Firm* — SCULLY, SCOTT, MURPHY & PRESSER, P.C.

(57) ABSTRACT

Systems and methods for injecting a current into are described. A switch converter can include a high-side switch and a low-side switch. A driver circuit can be configured to drive the high-side switch and the low-side switch in the switch converter. A controller can be configured to provide control signals to control the driver circuit. The driver circuit can further include a circuit configured to inject a current dip into a gate current outputted by the driver circuit to drive at least one of the high-side switch and the low-side switch.

17 Claims, 29 Drawing Sheets

100

400

Switch a switch among a high-side switch and a low-side switch of a switch converter

402

In response to detecting the occurrence of the ringing, inject a current dip into a gate current being used for driving the switch being switched

404

DIP INJECTION FOR GATE DRIVERS

CROSS-REFERENCE TO RELATED APPLICATION

The present application claims the benefit of U.S. Patent Application No. 63/460,476, titled "DIP INJECTION FOR LOW EMI GATE DRIVE" and filed on Apr. 19, 2023, which is hereby incorporated by reference in its entirety.

BACKGROUND OF THE SPECIFICATION

The present disclosure relates in general to semiconductor devices. More specifically, the present disclosure relates to a dip injection for gate drivers to reduce ringing and electromagnetic interference (EMI).

A voltage regulator or switching converter can convert an input voltage into an output voltage having a desired voltage level. The switching converter can include a controller, a pair of gate drivers, and a pair of switches that include a high-side switch and a low-side switch. The controller can provide control signals (e.g., pulse width modulation (PWM) or pulse-frequency modulation (PFM) signals) to a pair of gate drivers. The gate drivers can drive a high-side switch and a low side switch alternately according to the control signal. The alternate switching can convert the input voltage into the output voltage.

SUMMARY

In one embodiment, a semiconductor device for operating a switch converter is generally described. The semiconductor device can include a driver circuit configured to drive a high-side switch and a low-side switch of a switch converter. The semiconductor device can further include a circuit configured to inject a current dip into a gate current outputted by the driver circuit to drive at least one of the high-side switch and the low-side switch.

In one embodiment, a system for operating a switch converter is generally described. The system can include a switch converter including a high-side switch and a low-side switch. The system can further include a driver circuit. The system can further include a controller configured to provide control signals to control the driver circuit. The driver circuit can be configured to drive the high-side switch and the low-side switch in the switch converter. The driver circuit can be configured to inject a current dip into a gate current outputted by the driver circuit to drive at least one of the high-side switch and the low-side switch.

In one embodiment, a method for operating a switch converter is generally described. The method can include switching a high-side switch and a low-side switch of a switch converter. The method can further include injecting a current dip into at least one gate current being used for driving at least one of the high-side switch and the low-side switch to reduce ringing at a switch node between the high-side switch and the low-side switch.

BRIEF DESCRIPTION OF THE DRAWINGS

FIG. 3C-1 and FIG. 3C-2 are diagrams showing an impact of dip injection for gate drivers in a second scenario in one embodiment.

FIG. 3D-1 and FIG. 3D-2 are diagrams showing an impact of dip injection for gate drivers in a third scenario in one embodiment.

FIG. 3E-1 and FIG. 3E-2 are diagrams showing an impact of dip injection for gate drivers in a fourth scenario in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Ringing can occur at a switch node between the high-side switch and the low-side switch of a switching converter after one of the high-side and low-side switches are turned on and turned off. Ringing can cause the switching converter to emit unwanted radio frequency noise known as electromagnetic interference (EMI) that can cause electronics to operate poorly, malfunction or stop working completely. If the high-side and low-side switches are being driven at a relatively faster rate, an efficiency of the switching converter can increase, hence reducing loss, but EMI can increase. If the high-side and low-side switches are being driven at a relatively slower rate, an efficiency of the switching converter can decrease, hence increasing loss, but EMI can be reduced.

Figure 1A:
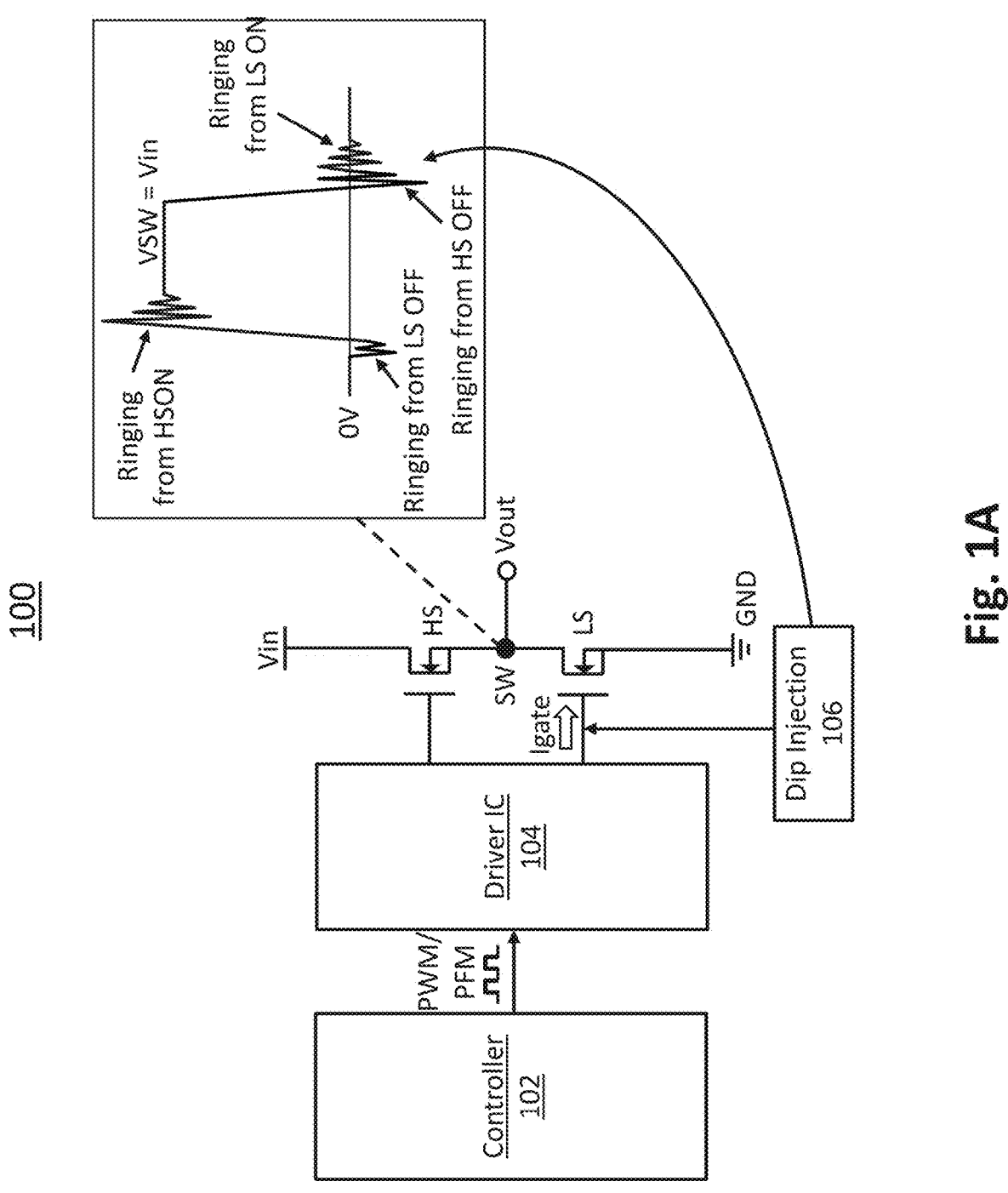
FIG. 1A is a diagram showing a system that can implement dip injection for gate drivers in one embodiment.

FIG. 1A is a diagram showing a system that can implement dip injection for gate drivers in one embodiment. A system 100 shown in FIG. 1A can include at least a controller 102, a driver integrated circuit (IC) 104, a high-side switch labeled as HS and a low-side switch labeled as LS. Driver IC 104 can include a driver configured to drive HS and another driver configured to drive LS. Controller 102 can provide a control signal (e.g., PWM or PFM) to driver IC 104 and drivers in driver IC 104 can drive HS and LS alternately to convert an input voltage Vin into an output voltage Vout. System 100 can be implemented by an apparatus such as a semiconductor device. In one embodiment, HS and LS switches can be field-effect transistors (FETs) such as metal oxide semiconductor field effect transistors (MOSFETs). In other embodiments, HS and LS switches can be diodes or insulated-gate bipolar transistors (IGBTs).

When HS is switched on, LS is switched off, and when LS is switched on, HS is switched off. When HS is switched on and LS is switched off, a voltage VSW at a switch node SW between HS and LS can be pulled up to Vin such that VSW is equivalent to Vin. When HS is switched off and LS is switched on, voltage VSW at switch node SW can be pulled down to ground hence VSW is equivalent to zero. Ringing can occur at switch node SW at each instant where one of HS and LS is being switched on and switched off. The transition of both HS and LS switches can contribute to the ringing. For example, the VSW waveform shown in FIG. 1A illustrates a case where a current flow direction at switch node SW is away from SW. Each one of the transitions-namely LS from on to off, HS from off to on, HS from on to off, and LS from off to on, can contribute to the ringing shown in the waveform in FIG. 1A.

Ringing at switch node SW can cause system 100 to emit unwanted radio frequency noise such as electromagnetic interference (EMI). EMI can increase as ringing at switch node SW increases, hence it is desirable to reduce ringing at switch node SW when HS and LS are being switched on and off. However, there is a trade-off between EMI and energy loss. If driver IC 104 drives HS and LS at a relatively faster rate, an efficiency of system 100 can increase, hence reducing loss, but EMI can increase. If driver IC 104 drives HS and LS at a relatively slower rate, an efficiency of system 100 can decrease, hence increasing loss, but EMI can be reduced.

To reduce ringing (which would also reduce EMI) and reduce energy loss, system 100 can perform a dip injection 106 to inject a current dip to a gate current Igate being used for driving one of HS and LS. Dip injection 106 can be implemented by hardware, software, or a combination of hardware and software in system 100. By way of example, dip injection 106 can be implemented by a dip injection circuit in driver IC 104. In another example, dip injection 106 can be implemented by controller 102. Various implementations of dip injection 106 will be described in more detail below. The current dip can be a positive dip that increases Igate for a relatively brief duration, or a negative dip that decreases Igate for a relatively brief duration. Dip injection 106 can provide a positive dip or a negative dip depending on whether the switch (either HS or LS) being driven by Igate is being switched off or switched on. The current dip being provided by dip injection 106 can reduce ringing at switch node SW and also shorten a transition time for the switch (HS or LS) being driven by Igate to switch from off to on, or from on to off, and this shorten transition time can reduce switching loss. In the embodiment shown in FIG. 1A, dip injection 106 can be performed for injecting a current dip to Igate that drives LS.

Controller 102 can be configured to detect occurrences of ringing at switch node SW. In one embodiment, controller 102 can compare a frequency and/or an amplitude of switch node voltage VSW with predefined thresholds. If the frequency and/or amplitude of VSW exceeds the predefined thresholds, controller 102 can perform dip injection 106, or can control other hardware being implemented for dip injection 106, to inject a current dip in the gate current Igate. In another embodiment, controller 102 can be configured to perform dip injection 106, or can control other hardware being implemented for dip injection 106, to inject a current dip into Igate at specific times. By way of example, according to the control signal being outputted by controller 102, controller 102 can determine the switch on and switch off times of HS and LS switches. Controller 102 can determine that dip injection 106 shall be performed in accordance with the switch on and switch off times of HS and LS switches to reduce potential ringing that can occur at SW during the transitions.

Figure 1C:
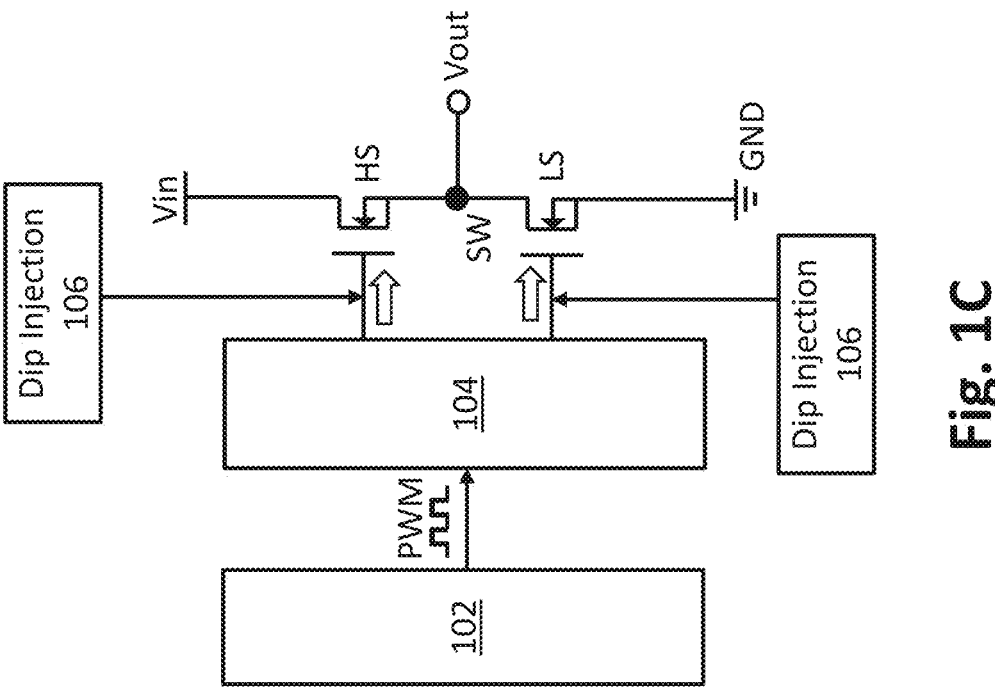
FIG. 1C is a diagram showing another system that can implement dip injection for gate drivers in one embodiment.
Figure 1B:
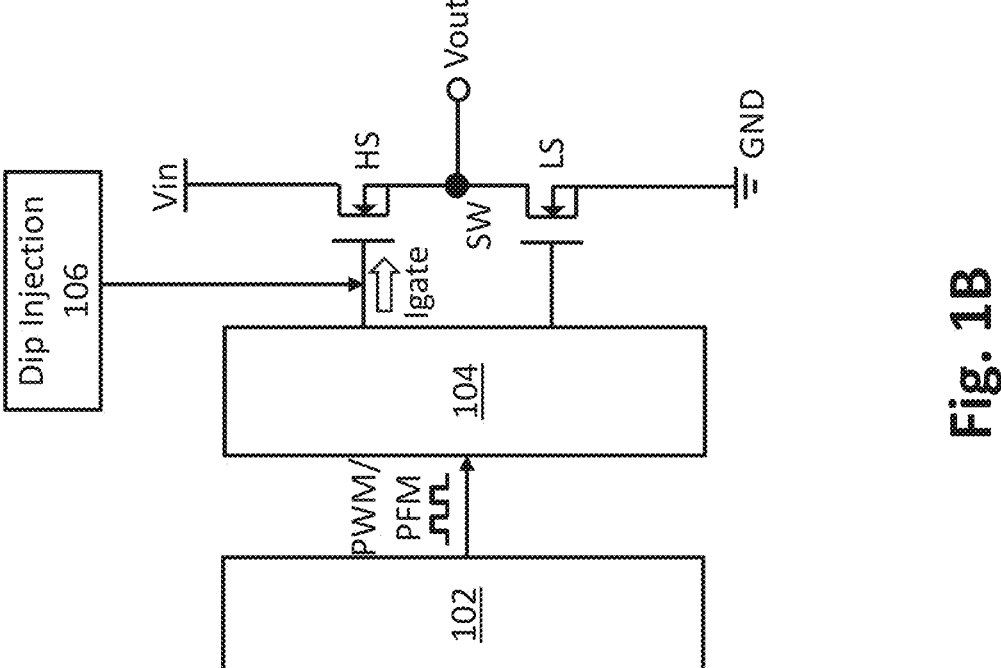
FIG. 1B is a diagram showing another system that can implement dip injection for gate drivers in one embodiment.
Figure 1D:
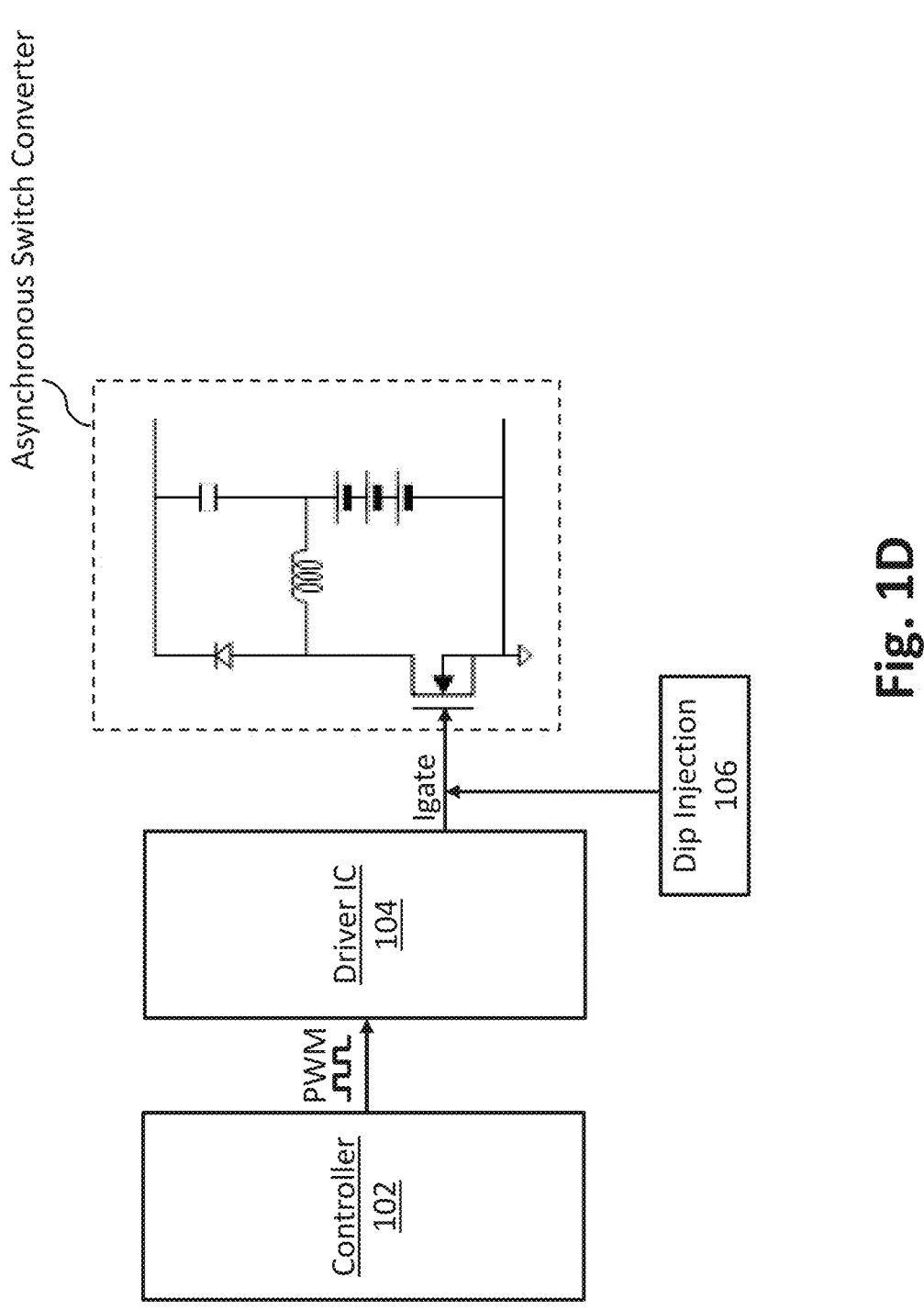
FIG. 1D is a diagram showing another system that can implement dip injection for gate drivers in one embodiment.

In another embodiment shown in FIG. 1B, dip injection 106 can be performed for injecting a current dip to gate current that drives HS. In another embodiment shown in FIG. 1C, dip injection 106 can be performed for injecting current dip to gate currents for both HS and LS. Further, as shown in FIG. 1D, dip injection 106 described herein can be performed for asynchronous switch converters where HS and LS are different types of switches. In one embodiment shown in FIG. 1E, dip injection 106 can be performed for a boost converter having asynchronous switches, where HS is a diode and LS is a FET.

Figure 1E:
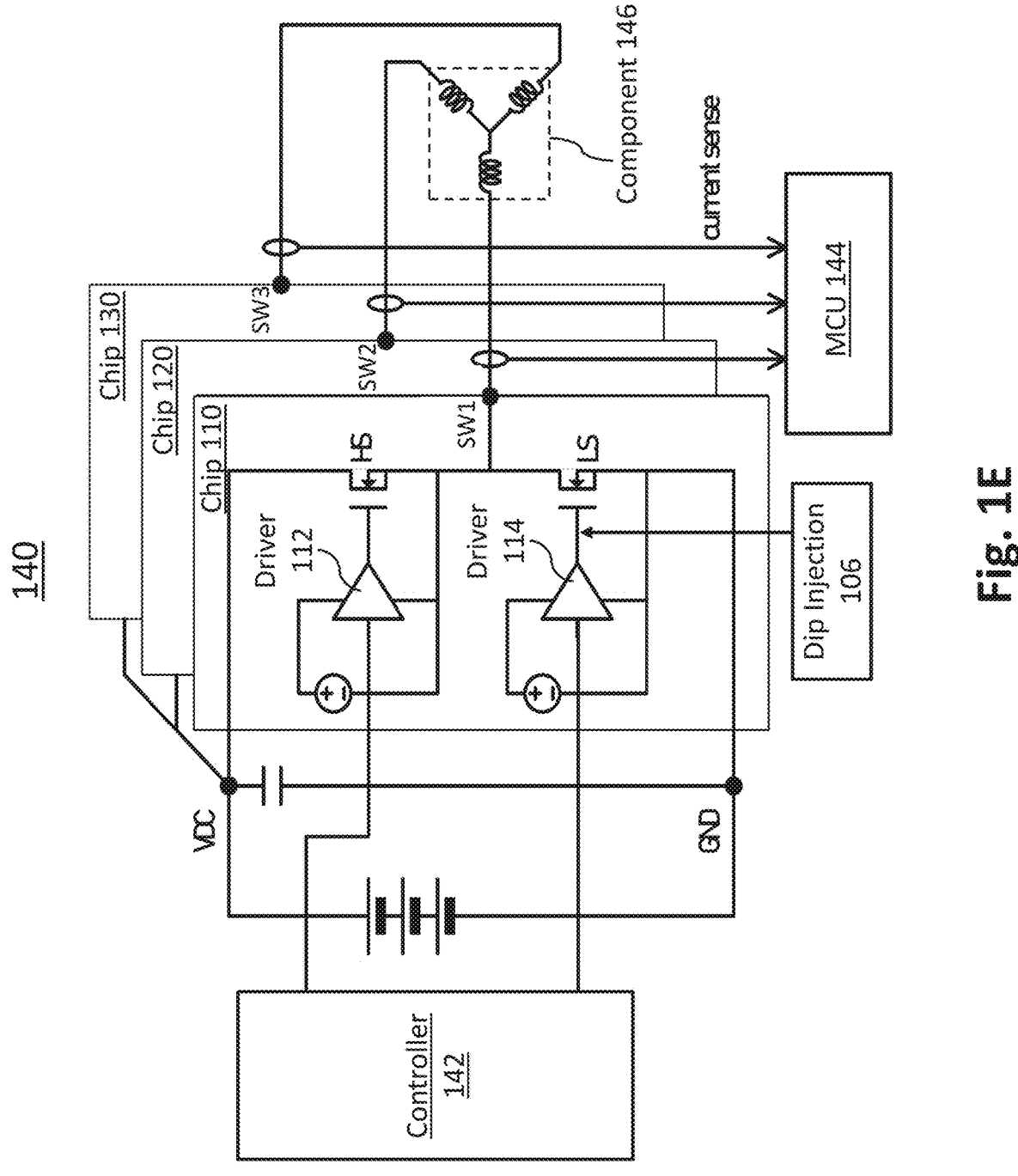
FIG. 1E is a diagram showing an application of a dip injection circuit in one embodiment.

FIG. 1E is a diagram showing an application of a dip injection circuit in one embodiment. In an example shown in FIG. 1E, a system 140 can be part of an electronic vehicle (EV). System 140 can include a plurality of chips 110, 120, 130, a controller 142, a master control unit (MCU) 144 and a component 146. Controller 142 can be same as controller 102 shown in FIG. 1A. Each one of chips 110, 120, 130 can include a driver IC, such as driver IC 104, and a pair of switches such as HS and LS as shown in FIG. 1A. Chip 110 can include a driver 112 configured to drive HS and a driver 114 configured to drive LS, where driver 112 and driver 114 can be a part of driver IC 104 shown in FIG. 1A.

Other applications that can implement dip injection 106 can include traction inverters, on-board chargers, DC-DC converters, or any switching systems in EVs that has ringing in switch nodes. For example, controller 142 and chips 110, 120, 130 can implement a traction inverter that manages the flow of energy from a high-voltage battery pack of the EV to component 146. If component 146 is a rotor of a motor in an EV, system 140 can include a total of six drivers and six switches that controls the rotor. A rotor can include three coils, and each coil in the rotor received power from one of chips 110, 120, 130 via switch nodes SW1, SW2, SW3, respectively. MCU 144 can be a MCU of the EV and can perform various functions, such as sensing current from switch nodes SW1, SW2, SW3 and communicating the sensed current to controller 142 to perform closed-loop control of the rotor. For EVs that has a brushless motor, component 146 can be a stator.

In the example shown in FIG. 1E, dip injection 106 can be performed for injecting a current dip in a gate current being used for driving LS in chip 110. As a result of injecting current dip into the gate current being used for driving LS in chip 110, ringing at switch node SW1 can be reduced. In another embodiment (not shown), dip injection 106 can be performed in chip 110 to inject a current dip in a gate current being used for driving HS in chip 110 to reduce ringing at switch node SW1. Chips 120, 130 can also include respective copies of dip injection 106 to reduce ringing at switch nodes SW2, SW3.

Figure 2A:
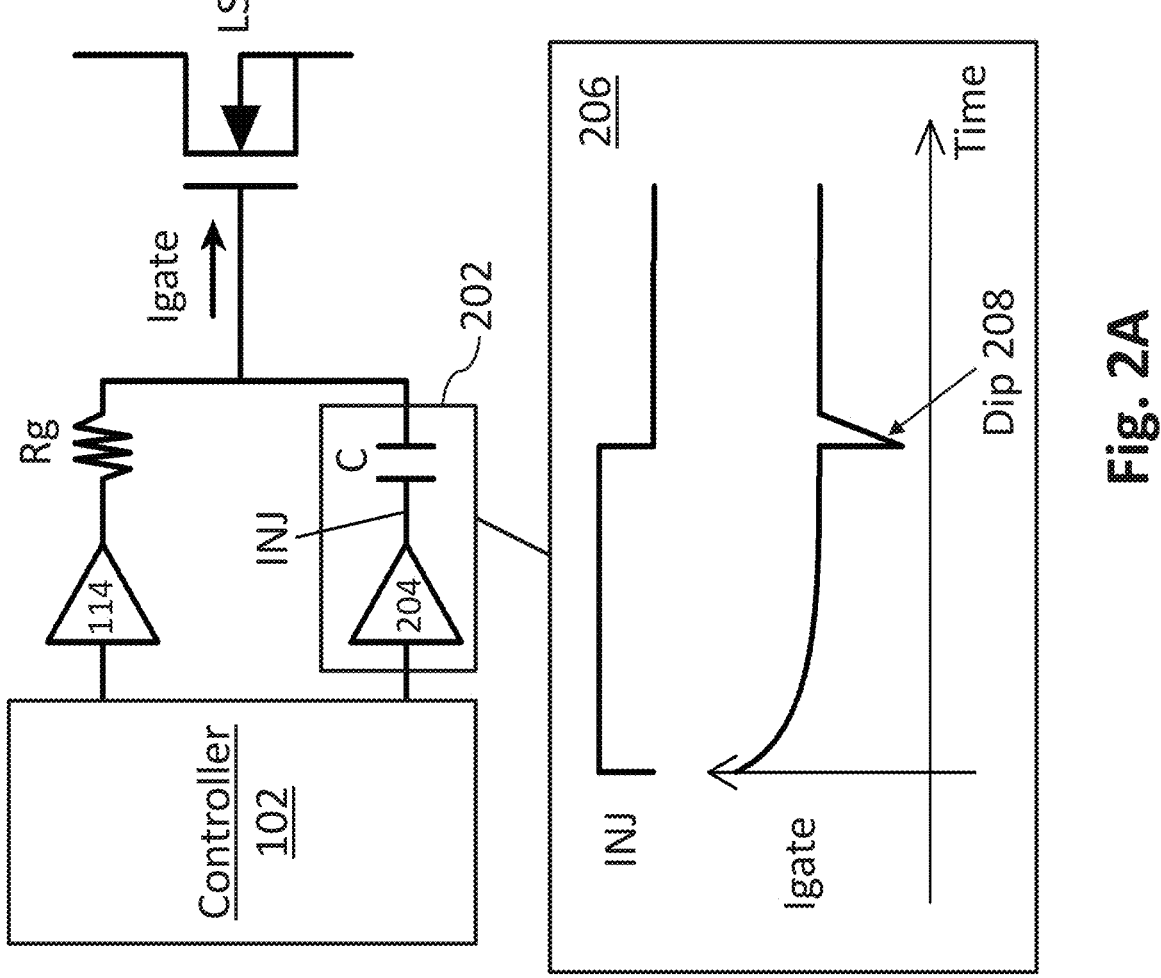
FIG. 2A is a diagram showing an example implementation of dip injection for gate drivers in one embodiment.

FIG. 2A is a diagram showing an example implementation of dip injection for gate drivers in one embodiment. In an example shown in FIG. 2A, LS can be driven in voltage mode by driver 114 and dip injection 106 in FIG. 1A and FIG. 1B can be implemented by a dip injection circuit 202. Voltage being outputted by driver 114 can be applied on a gate resistor Rg to generate gate current Igate. Dip injection circuit 202 can include an amplifier 204 and a capacitor C. Referring to waveforms 206 shown in FIG. 2A, an injection signal INJ can be outputted by amplifier 204 and when INJ transitions from HIGH to LOW, a negative dip 208 is injected into gate current Igate being used for driving LS. Further, a capacitance of capacitor C can define a size, such as a duration and an amplitude, of dip 208.

Figure 2B:
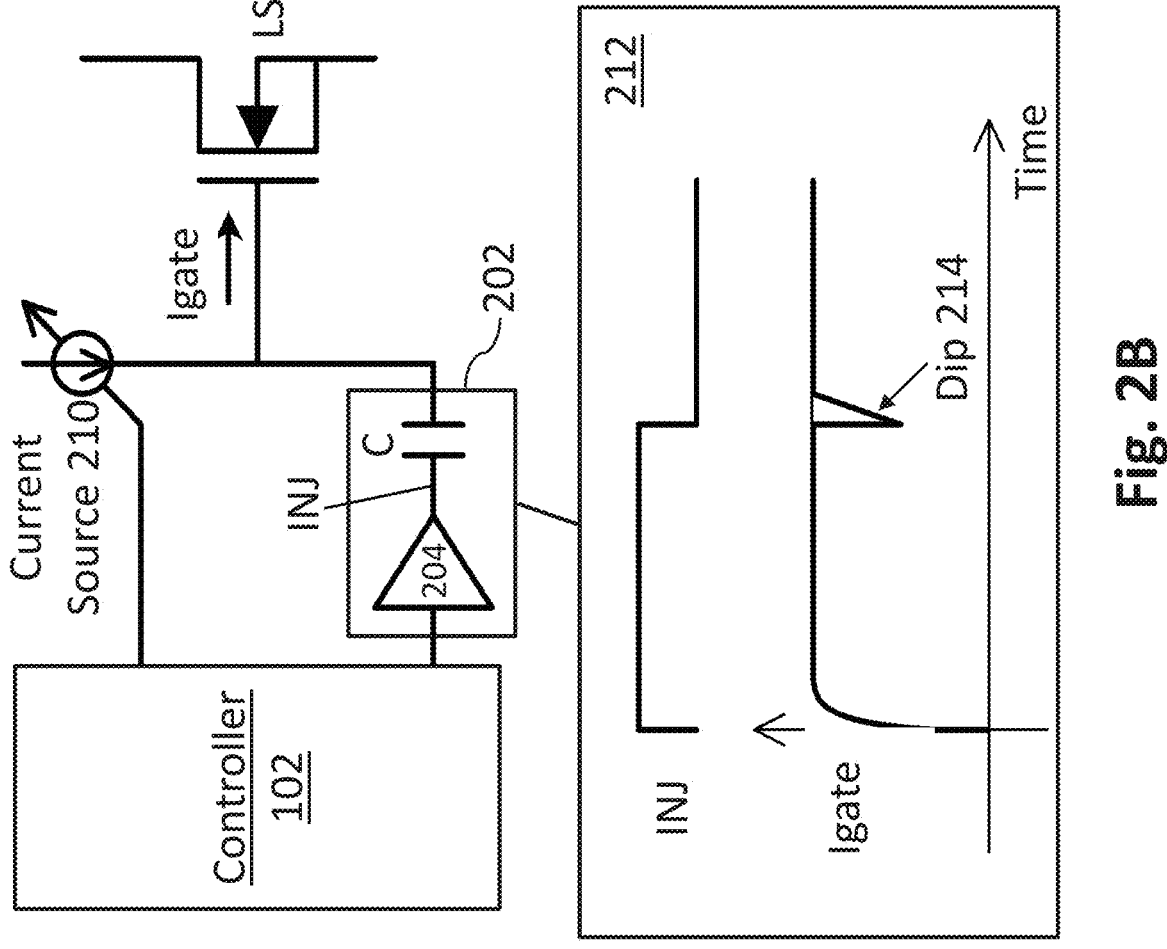
FIG. 2B is a diagram showing another example implementation of dip injection for gate drivers in one embodiment.

FIG. 2B is a diagram showing another example implementation of dip injection for gate drivers in one embodiment. In an example shown in FIG. 2B, LS can be driven in current mode by a current source 210 and dip injection 106 in FIG. 1A and FIG. 1B can be implemented by dip injection circuit 202. Current being outputted by current source 210 can be the gate current Igate. Referring to waveforms 212 shown in FIG. 2B, injection signal INJ can be outputted by amplifier 204 and when INJ transitions from HIGH to LOW, a negative dip 214 is injected into gate current Igate being used for driving LS.

Figure 2C:
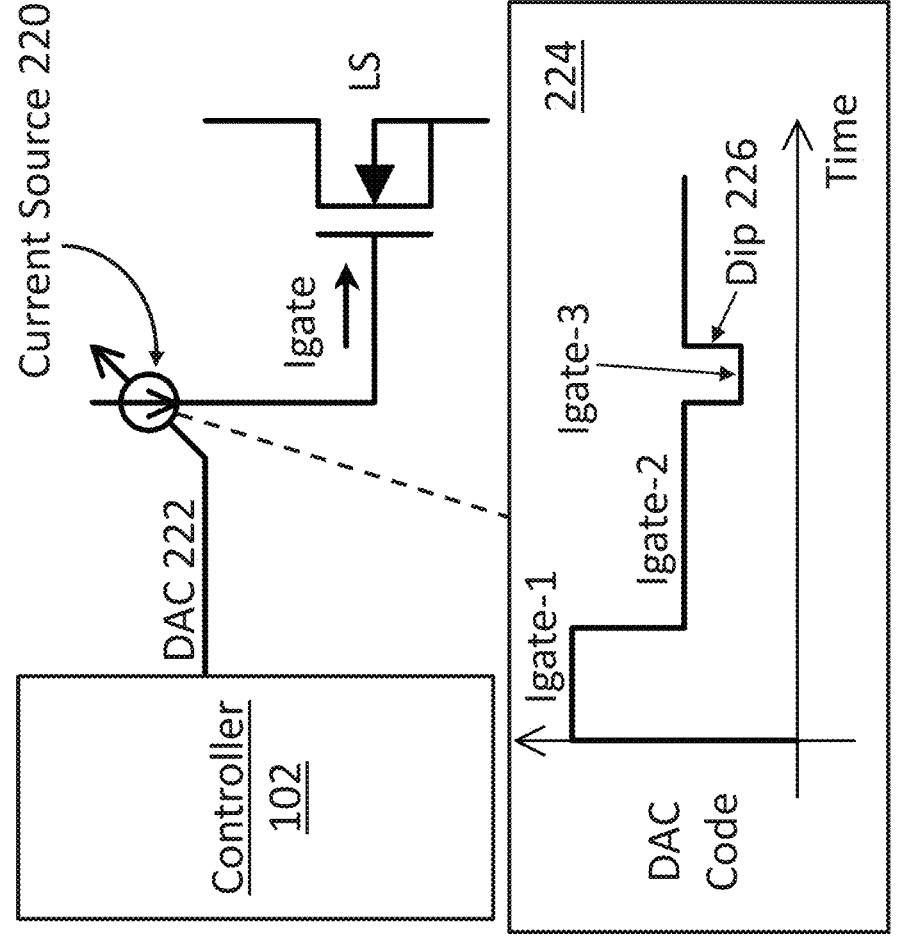
FIG. 2C is a diagram showing another example implementation of dip injection for gate drivers in one embodiment.

FIG. 2C is a diagram showing another example implementation of dip injection for gate drivers in one embodiment. In an example shown in FIG. 2C, LS can be driven in current mode by a current source 220 selected using a digital-to-analog converter (DAC) code 222. DAC code 222 can be a quantized analog output converted from a binary digital input code. DAC code 222 can be generated by controller 102, or in some embodiments, specific circuits (e.g., logic circuits or integrated circuits) in controller 102 configure to generate different DAC codes under different scenarios. Different DAC codes can cause different current source to be selected for outputting Igate that drives LS, and the different current sources can provide different values of Igate. Referring to waveforms 224 shown in FIG. 2C, a first DAC code can result in a first current gate value Igate-1, a second DAC code can result in another gate current value Igate-2, and a third DAC code can result in a gate current value Igate-3 that generates a dip 226. Using different DAC code to inject a dip in the gate current can allow a dip of any size or shape to be generated.

Figure 2D:
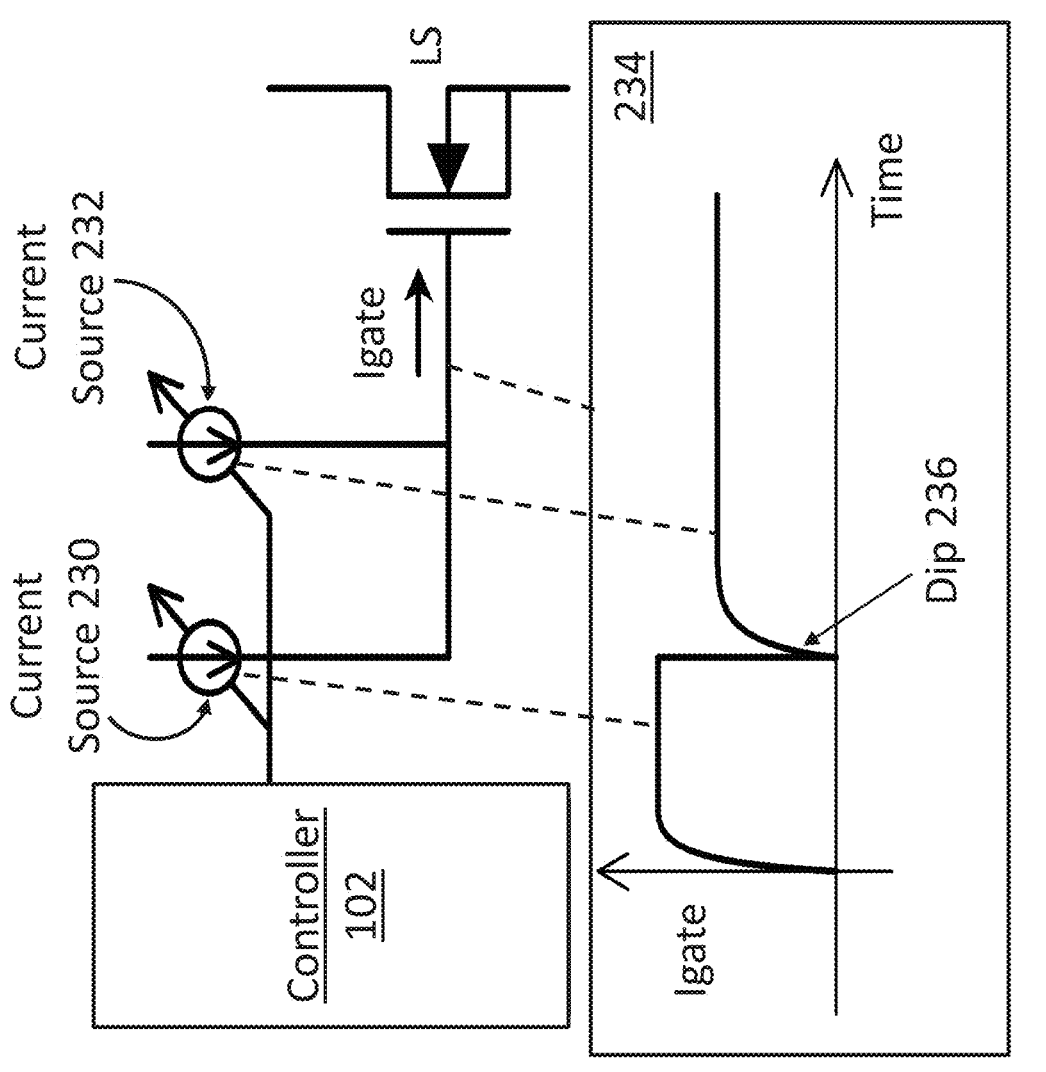
FIG. 2D is a diagram showing another example implementation of dip injection for gate drivers in one embodiment.

FIG. 2D is a diagram showing another example implementation of dip injection for gate drivers in one embodiment. In an example shown in FIG. 2D, LS can be driven in current mode by more than one current sources 230, 232. Each one of current sources 230, 232 can output different amount of current to modify Igate differently. Referring to waveforms 234 shown in FIG. 2D, Igate can be initially outputted by current source 230. To generate a dip 236, current source 232 can be activated to modify Igate by pulling down Igate, which generates dip 236. Hence, the overlap of current generated by more than one current sources can be used for injecting a current dip into Igate being used for driving LS. In one embodiment, controller 102 can output control signals that control different timings to activate or deactivate current sources 230, 232. In some embodiments, specific circuits (e.g., logic circuits or integrated circuits) in controller 102 can be configured to generate control signals for activating or deactivating current sources 230, 232 at different timings.

Figure 2E:
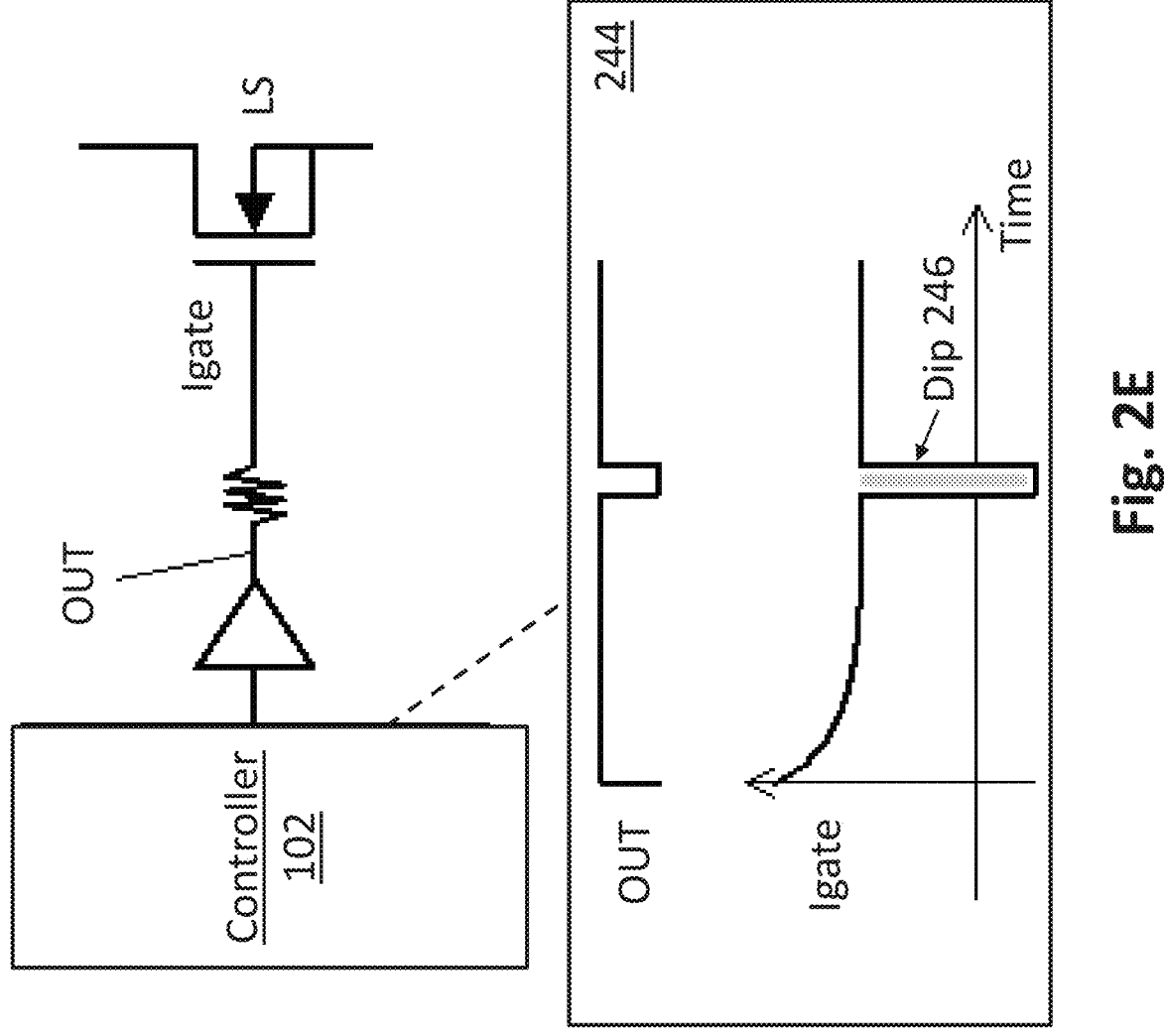
FIG. 2E is a diagram showing another example implementation of dip injection for gate drivers in one embodiment.
Figure 2F:
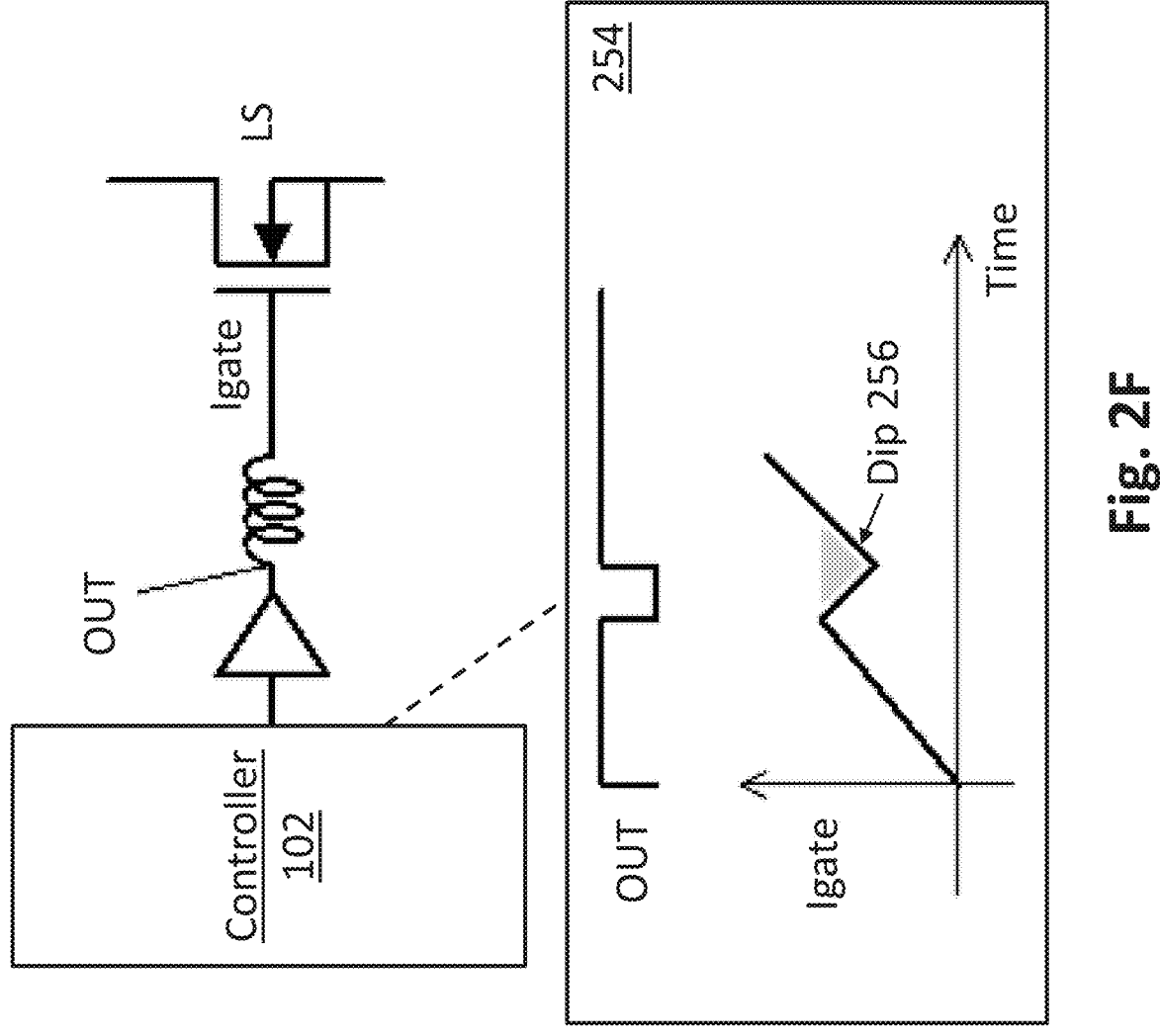
FIG. 2F is a diagram showing another example implementation of dip injection for gate drivers in one embodiment.

FIG. 2E is a diagram showing another example implementation of dip injection for gate drivers in one embodiment. In an example shown in FIG. 2E, controller 102 can inject a current dip by reducing Igate at specific times. Controller 102 can output a timing signal labeled as OUT that transitions from high to low at a specific time, and the transition can cause a dip 236 to be injected into Igate. Note that when OUT is high, Igate remains at a normal rate. FIG. 2F shows a similar implementation where controller 102 outputs the timing signal OUT to reduce Igate at a specific time.

Figure 3A:
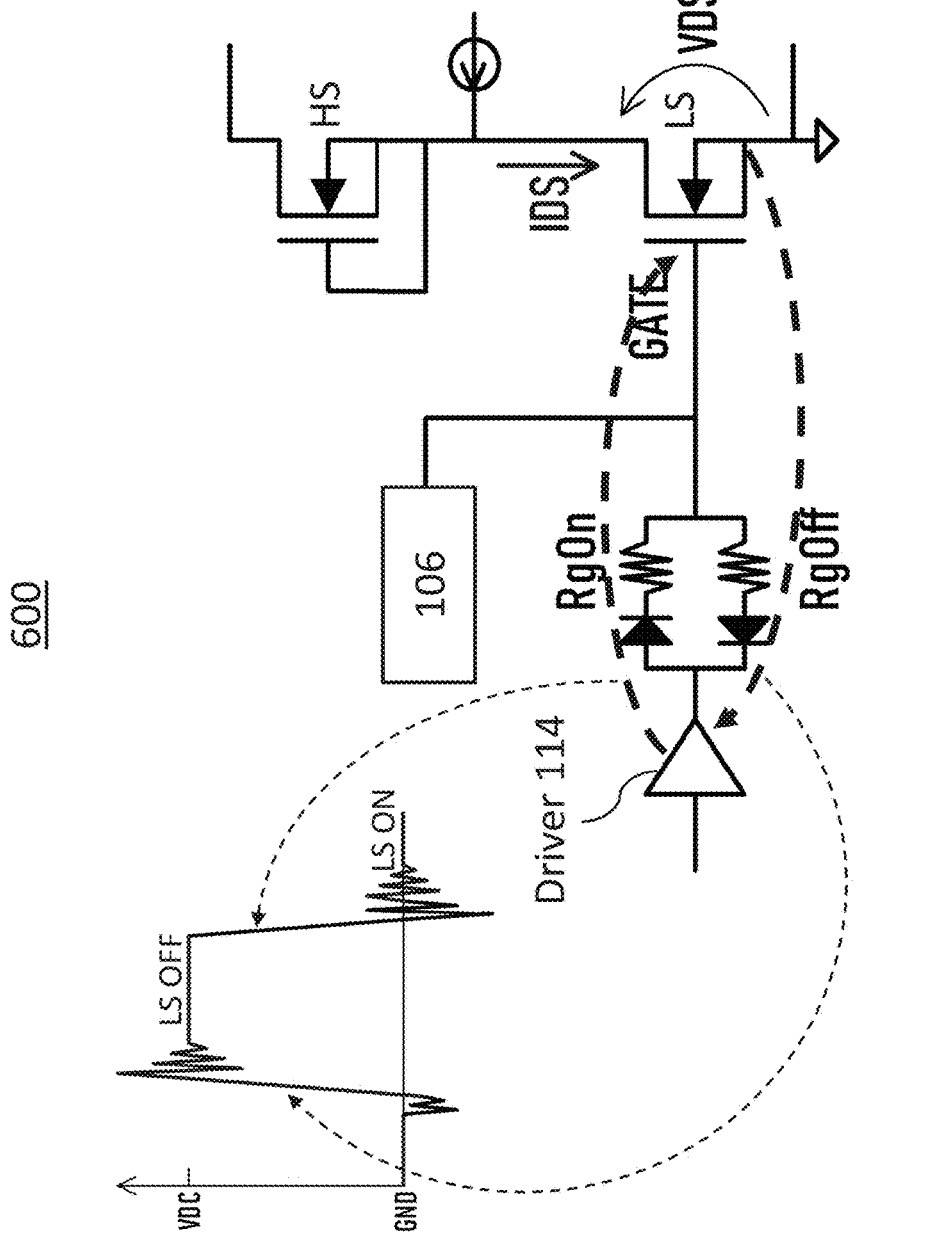
FIG. 3A is a diagram showing different gate current paths that can impact operations of a dip injection circuit in one embodiment.

FIG. 3A is a diagram showing different gate current paths that can impact operations of a dip injection circuit in one embodiment. In some applications, an asymmetrical gate drive is desired in order to have different turn-on and different turn-off speeds. An implementation of an asymmetrical gate driver is shown in FIG. 3A, where driver 114 and a first gate resistor RgOn forms a charging path, while driver 114 and RgOff forms a discharging path. To switch on LS, gate current Igate can flow from driver 114 to the gate of LS via RgOn. To switch off LS, LS can be discharged from a source terminal LS and the discharged current can flow back towards driver 114 and controller 102 (see FIG. 1A, FIG. 1B) and thereafter to ground.

Figures 1, 3B:
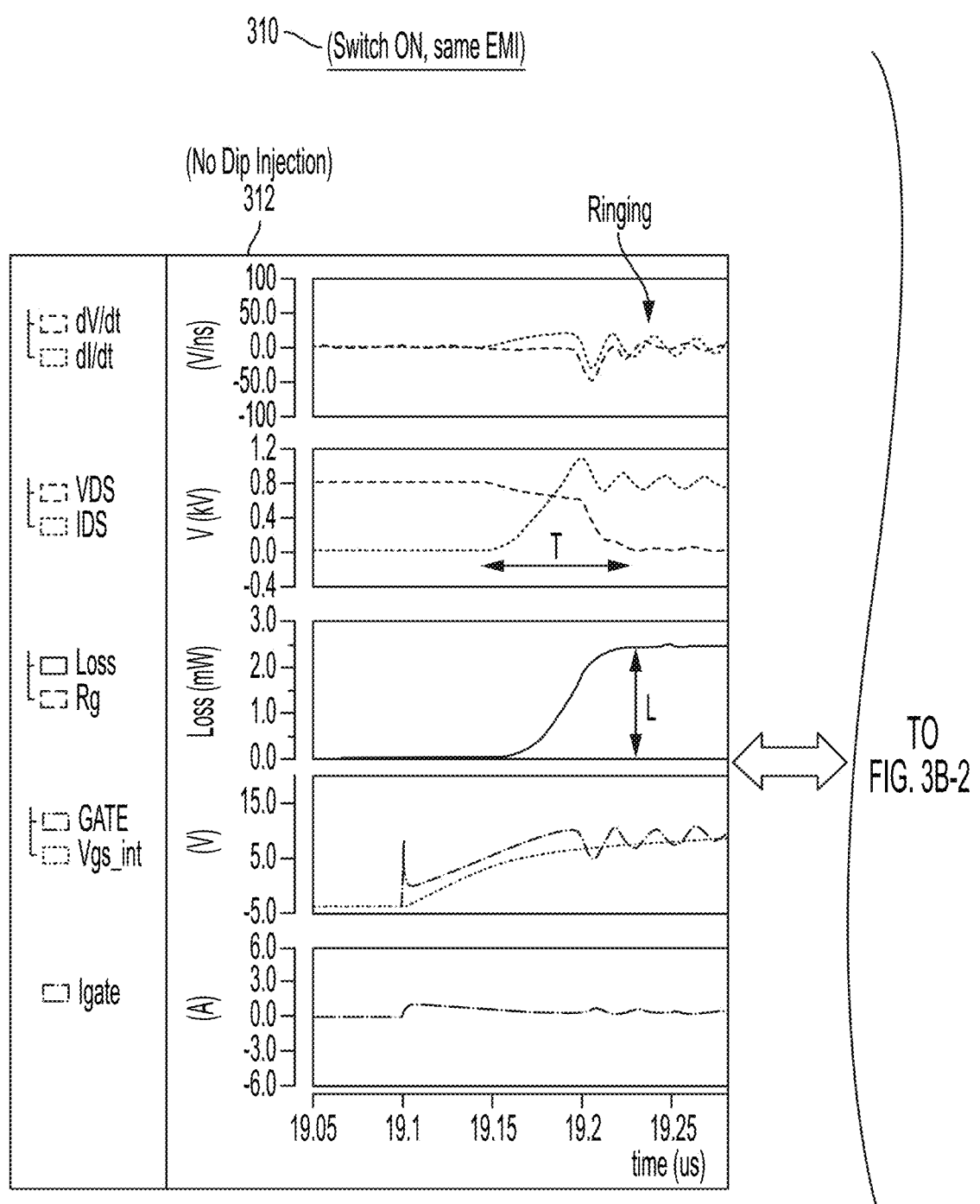
FIG. 3B-1 and FIG. 3B-2 are diagrams showing an impact of dip injection for gate drivers in a first scenario in one embodiment.
Figures 2, 3B:
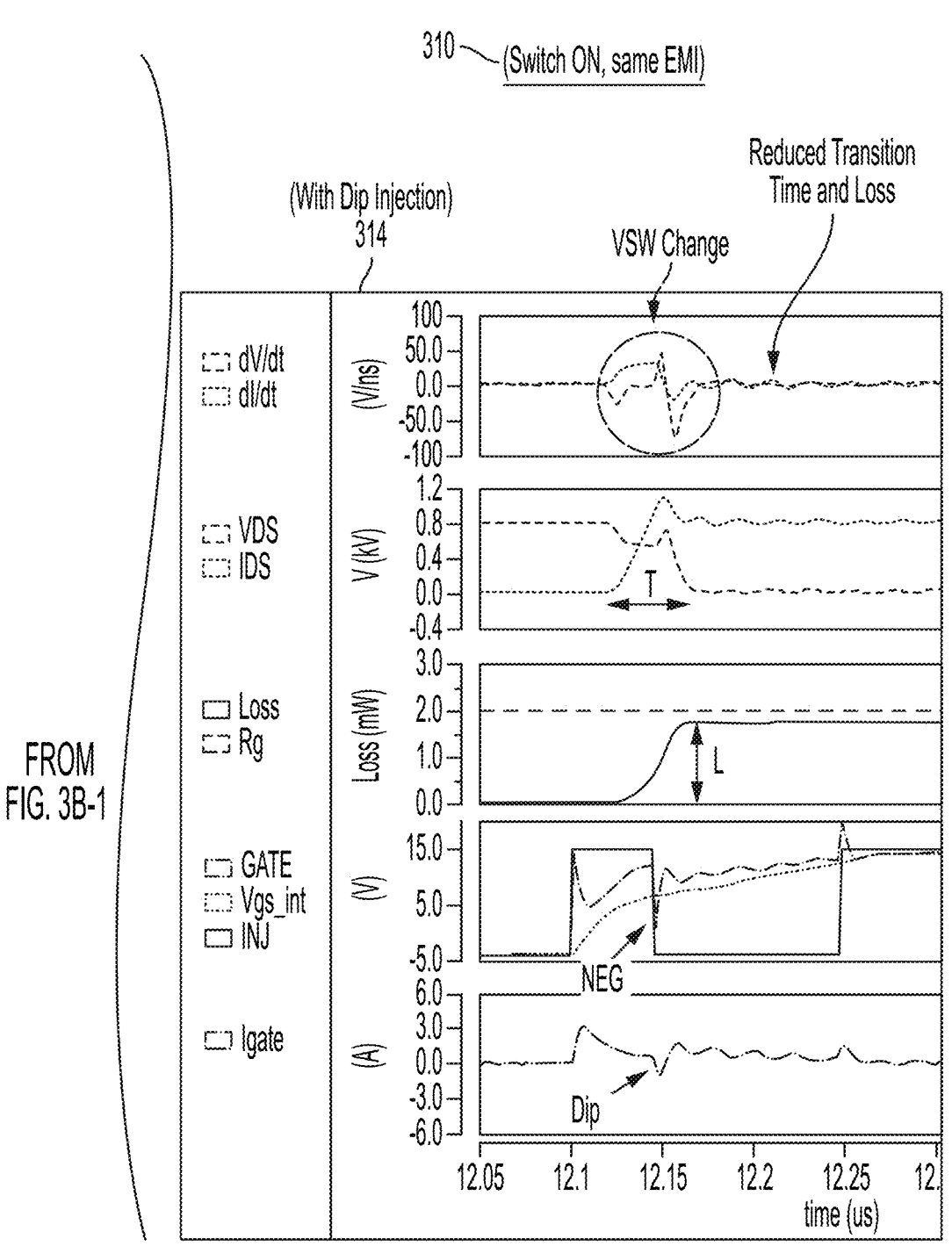

The dip injection 106 described herein can inject either a positive dip or a negative dip depending on whether an occurring transition is switching LS from on to off, or from off to on. Further, the dip injection 106 can impact ringing and energy loss under different switching scenarios (e.g., from off to on, or from on to off) and different fixed parameters. Referring to FIG. 3B-1 and FIG. 3B-2, a scenario 310 is shown where LS is being switched from off to on and EMI resulting from the switch is constrained to a fixed amount. In FIG. 3B-1 and FIG. 3B-2, waveforms 312 illustrate are various resulting parameters where dip injection was not performed, and waveforms 314 illustrate various resulting parameters where dip injection was performed, under scenario 310. In response to a switch node voltage VSW change that may have a frequency and/or an amplitude above predefined thresholds, dip injection 106 can be performed to insert a current dip in the gate current Igate that drives LS. Comparing waveforms 312 with 314, as a result of injection a negative dip, ringing, and a transition time T for LS to transition from off to on, can be reduced. The reduced transition time T can also lead to a reduction in energy loss L.

Figures 1, 3C:
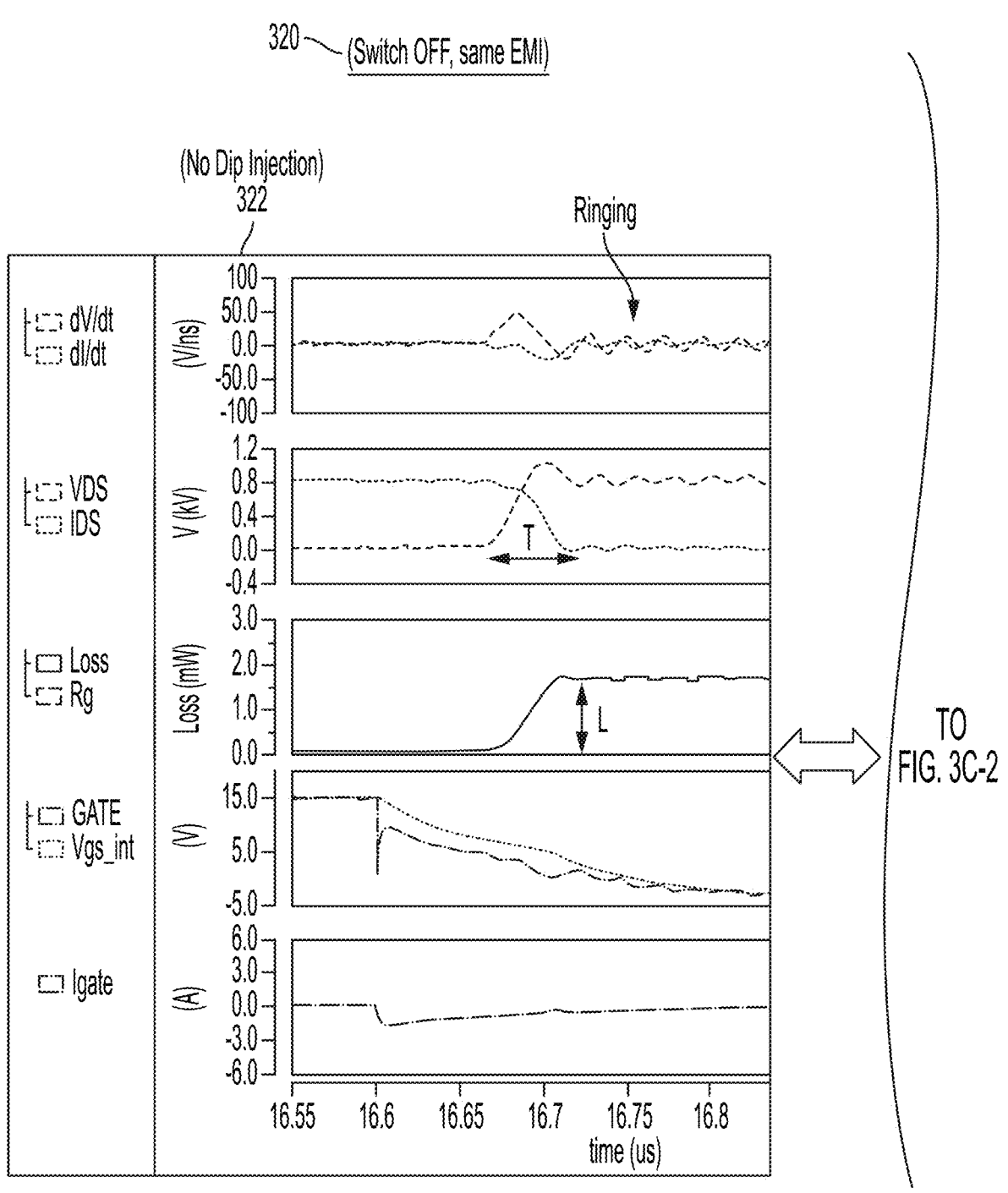
Figures 2, 3C:
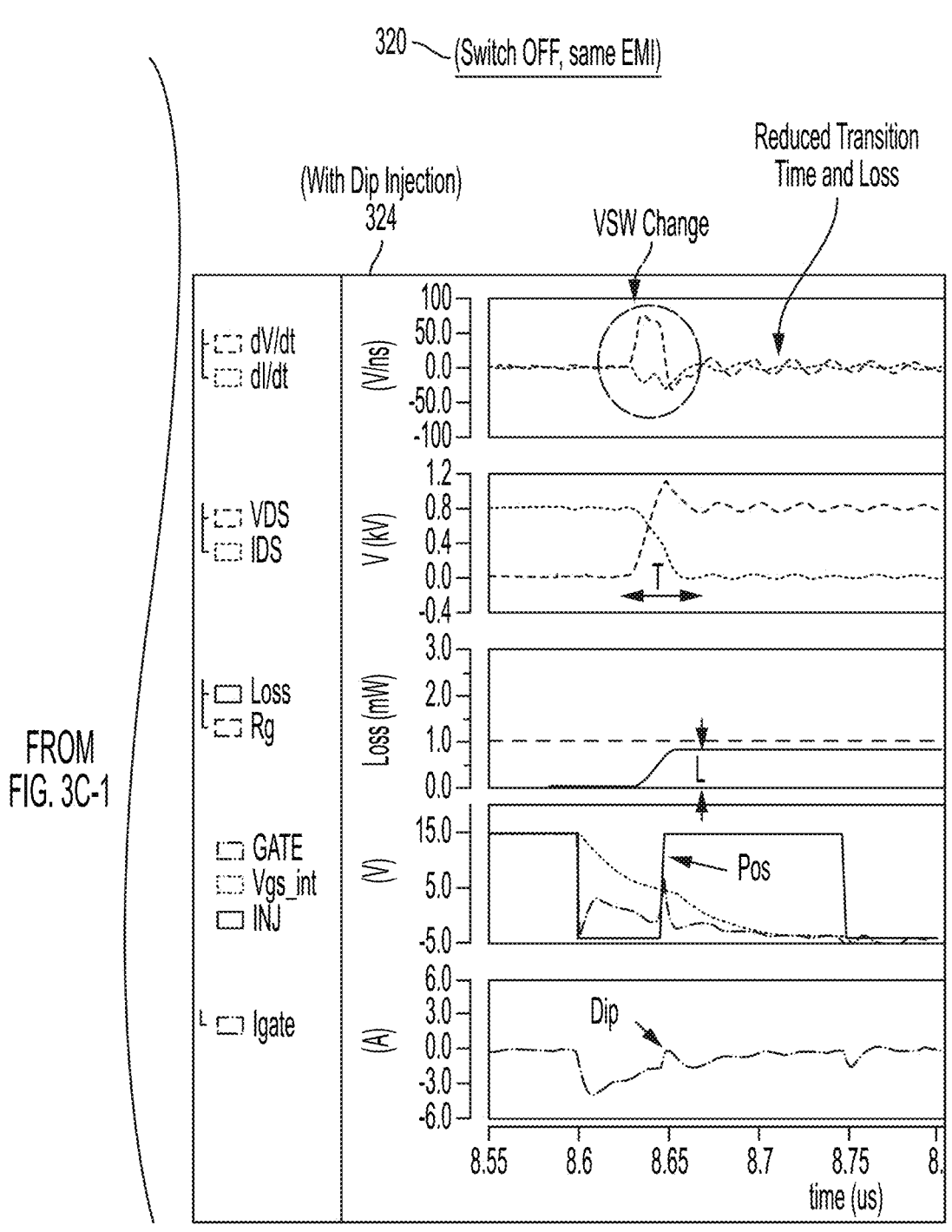

Referring to FIG. 3C-1 and FIG. 3C-2, a scenario 320 is shown where LS is being switched from on to off and EMI resulting from the switch is constrained to a fixed amount. In FIG. 3C-1 and FIG. 3C-2, waveforms 322 illustrate are various resulting parameters where dip injection was not performed, and waveforms 324 illustrate various resulting parameters where dip injection was performed, under scenario 320. In response to a switch node voltage VSW change that may have a frequency and/or an amplitude above predefined thresholds, dip injection 106 can be performed to insert a current dip in the gate current Igate that drives LS. Comparing waveforms 322 with 324, as a result of injection a positive dip, ringing, and the transition time T for LS to transition from on to off, can be reduced. The reduced transition time T also led to a reduction in energy loss L.

Figures 1, 3D:
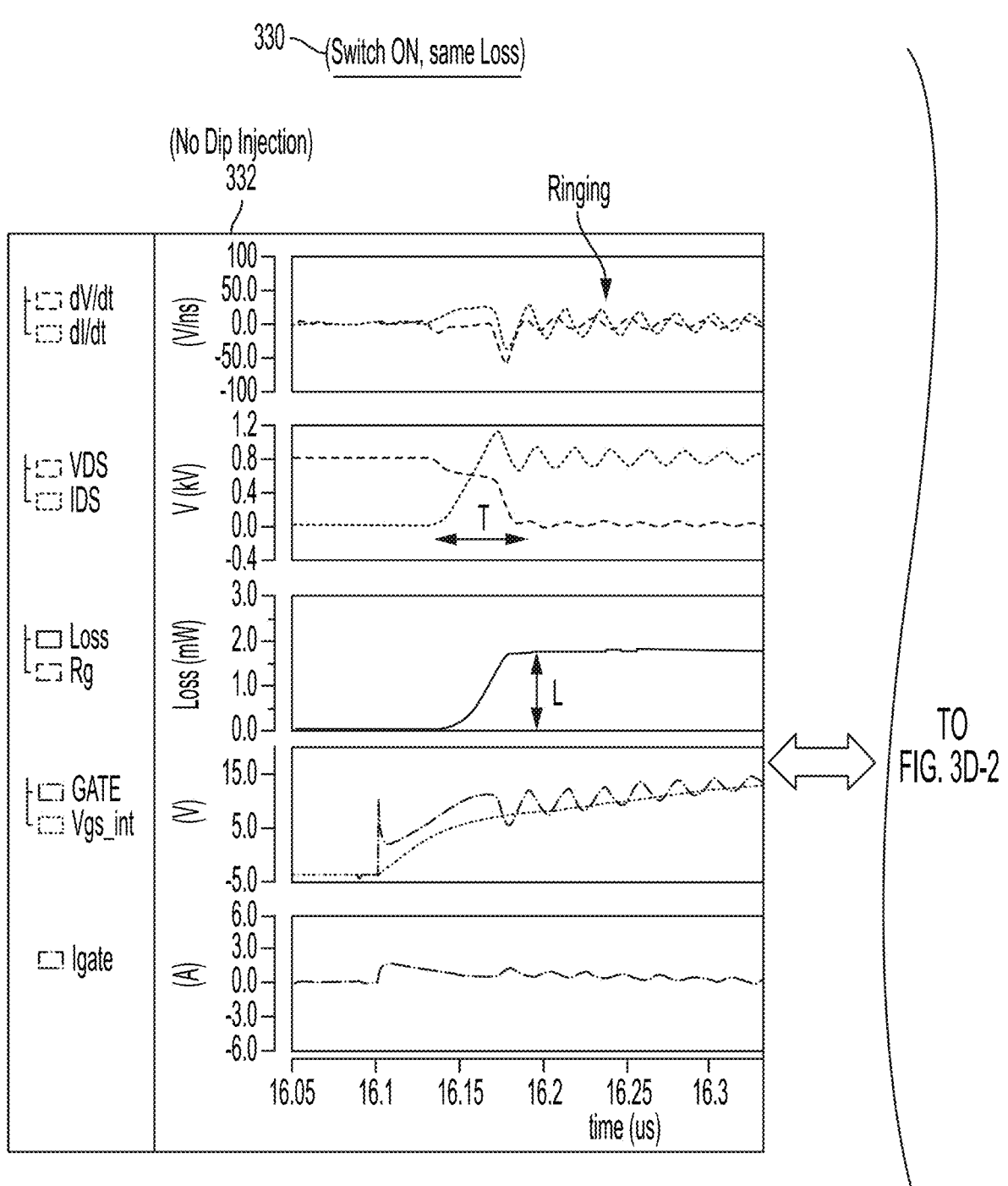
Figures 2, 3D:
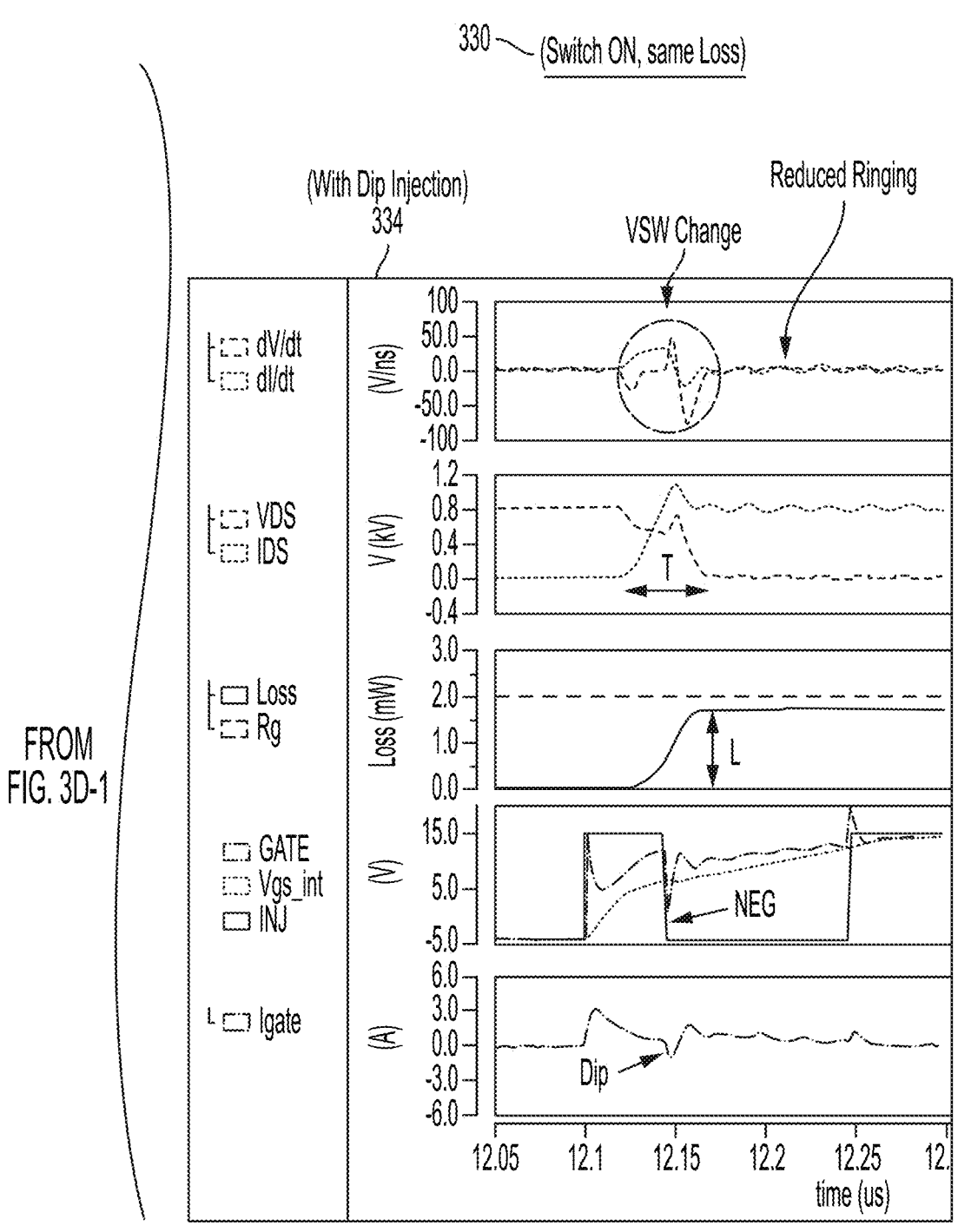

Referring to FIG. 3D-1 and FIG. 3D-2, a scenario 330 is shown where LS is being switched from off to on and energy loss resulting from the switch is constrained to a fixed amount. In FIG. 3D-1 and FIG. 3D-2, waveforms 332 illustrate are various resulting parameters where dip injection was not performed, and waveforms 334 illustrate various resulting parameters where dip injection was performed, under scenario 330. In response to a switch node voltage VSW change that may have a frequency and/or an amplitude above predefined thresholds, dip injection 106 can be performed to insert a current dip in the gate current Igate that drives LS. Comparing waveforms 332 with 334, as a result of injection a negative dip, ringing, and the transition time T for LS to transition from off to on, can be reduced. The reduced ringing can lead to a reduction of EMI.

Figures 1, 3E:
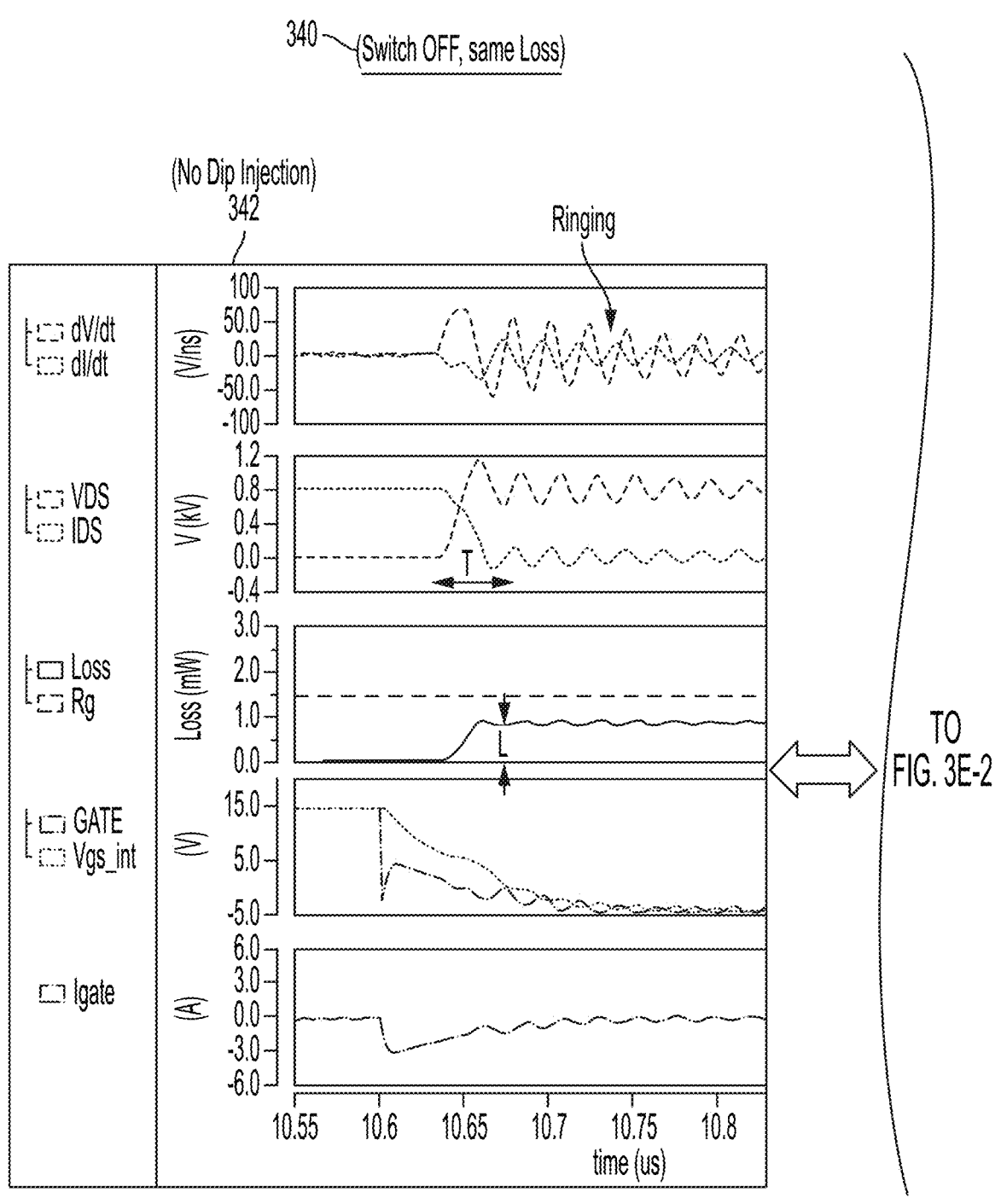
Figures 2, 3E:
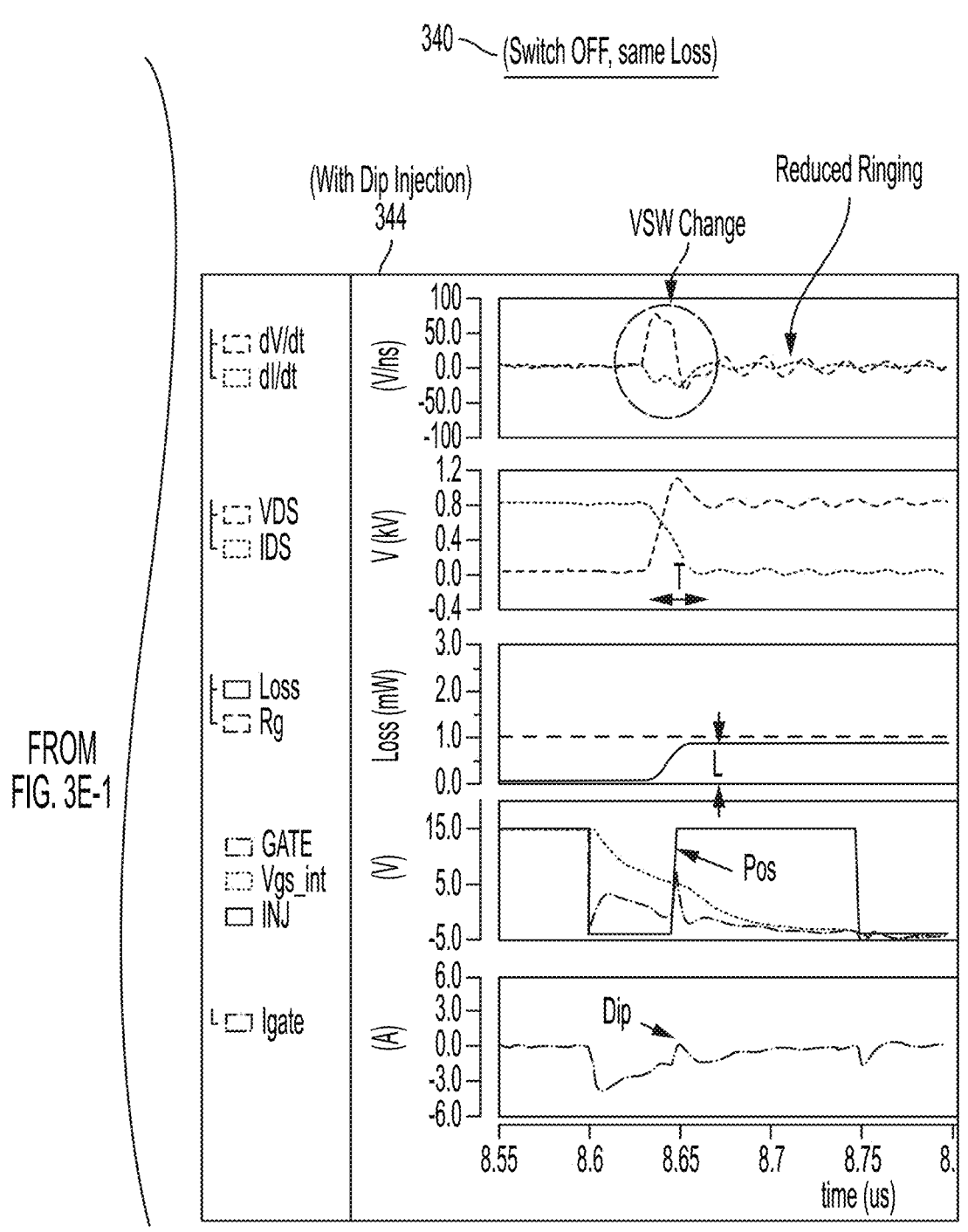

Referring to FIG. 3E-1 and FIG. 3E-2, a scenario 340 is shown where LS is being switched from on to off and energy loss resulting from the switch is constrained to a fixed amount. In FIG. 3E-1 and FIG. 3E-2, waveforms 342 illustrate are various resulting parameters where dip injection was not performed, and waveforms 344 illustrate various resulting parameters where dip injection was performed, under scenario 340. In response to a switch node voltage VSW change that may have a frequency and/or an amplitude above predefined thresholds, dip injection 106 can be performed to insert a current dip in the gate current Igate that drives LS. Comparing waveforms 334 with 344, as a result of injection a positive dip, ringing, and the transition time T for LS to transition from on to off, can be reduced. The reduced ringing can lead to a reduction of EMI.

Figure 4:
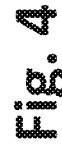
FIG. 4 illustrates a flow diagram of a process to implement dip injection for gate drivers in one embodiment.

FIG. 4 illustrates a flow diagram of a process to implement dip injection for gate drivers in one embodiment. The process 400 can include one or more operations, actions, or functions as illustrated by one or more of blocks 402 and/or 406. Although illustrated as discrete blocks, various blocks may be divided into additional blocks, combined into fewer blocks, eliminated, performed in different order, or performed in parallel, depending on the desired implementation.

Process 400 can be performed by, for example, system 100 shown in FIG. 1A, system 140 shown in FIG. 1B, or other systems including switch converters that can have occurrences of ringing at their switch nodes. Process 400 can begin at block 402. At block 402, a switch among a high-side switch and a low-side switch of a switch converter can be switched on or switched off. Process 400 can proceed from block 402 to block 404. At block 404, in response to detecting the occurrence of the ringing, a current dip can be injected into a gate current being used for driving the switch being switched.

In one embodiment, an occurrence of ringing can be detected at a switch node between the high-side switch and the low-side switch. In response to detecting the occurrence of the ringing, the current dip can be injected into the at least one gate current being used for driving at least one of the high-side switch and the low-side switch.

In one embodiment, detecting the occurrence of the ringing at the switch node can include determining a frequency of a voltage at the switch node exceeds a predefined threshold, and in response to the frequency of the voltage at the switch node exceeding the predefined threshold, determining that the ringing has occurred at the switch node.

In one embodiment, injecting the current dip into the at least one gate current can include injecting the current dip at a specific time to reduce the at least one gate current, receiving sensed current associated with at least one of the high-side switch and the low-side switch, and using a look-up table (LUT) to determine a dip setting of the current dip; and injecting the current dip in accordance with the dip setting.

In one embodiment, at least one of: ringing that occurs in sensed current associated with at least one of the high-side switch and the low-side switch and swinging of the ringing that occurs in sensed current associated with at least one of the high-side switch and the low-side switch, can be detected. At least one of the detected swinging and the detected ringing can be used for determining a dip setting of the current dip; and injecting the current dip in accordance with the dip setting.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5A:
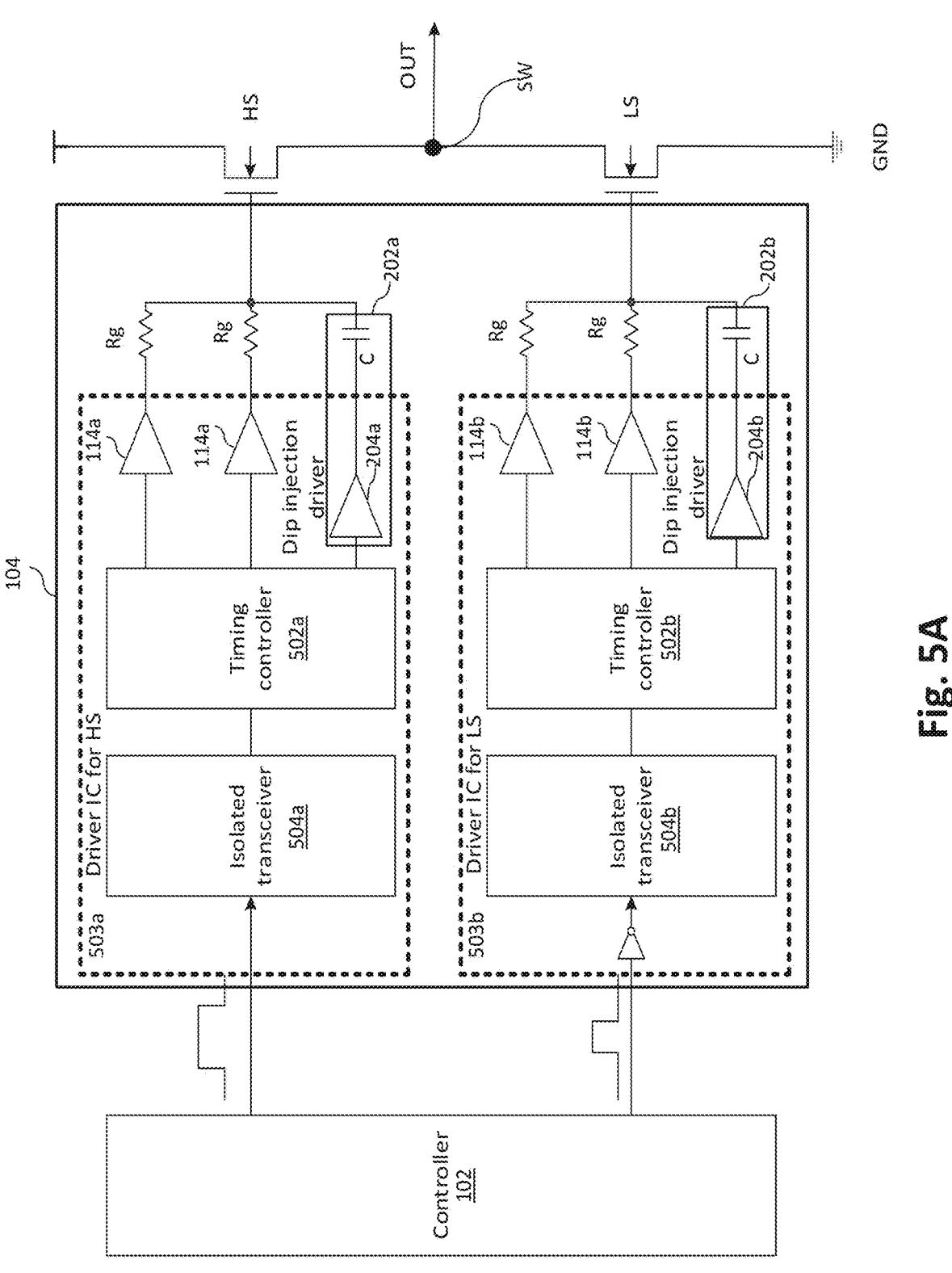
FIG. 5A is a diagram showing another example implementation of dip injection for gate drivers in one embodiment.

FIG. 5A is a diagram showing another example implementation of dip injection for gate drivers in one embodiment. Driver IC 104 can include a HS driver IC 503a configured to drive HS and a LS driver IC 503b configured to drive LS. HS driver IC 503a can include at least one driver 114a, an isolated transceiver 504a, a timing controller 502a and a dip injection circuit 202a. The at least one driver 114a can be configured to drive HS. Timing controller 502a can be configured to provide timing functions and settings to the dip injection circuit 204a and drivers 114a. Isolated transceiver 504a can be configured to forward communication information from controller 102 to timing controller 502a. Dip injection circuit 204a can be configured to inject a current dip into a gate current outputted by the at least one driver 114a. LS driver IC 503b can include at least one driver 114b, an isolated transceiver 504b, a timing controller 502b and a dip injection circuit 204b. The at least one driver 114b can be configured to drive LS. Timing controller 502b can be configured to provide timing functions and settings to the dip injection circuit 204b and drivers 114b. Isolated transceiver 504b can be configured to forward communication information from controller 102 to timing controller 502b. Dip injection circuit 204b can be configured to inject a current dip into a gate current outputted by the at least one driver 114b. The current dip injected by dip injection circuits 202a, 202b can reduce ringing at a switch node SW between HS and LS, and can also shorten a transition time for HS and LS to switch between on and off states. The shorten transition time can reduce switching loss.

Figure 5B:
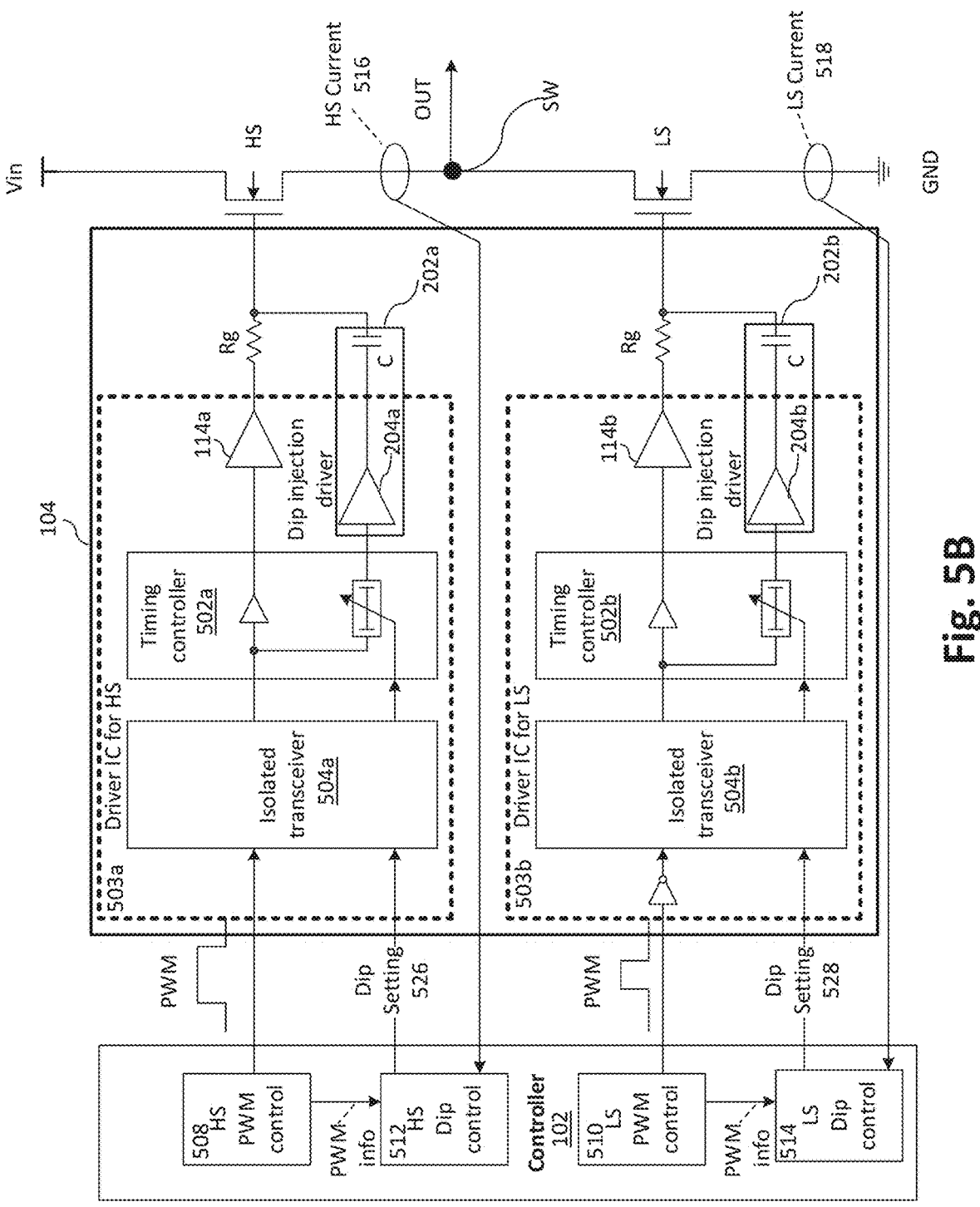
FIG. 5B is a diagram showing another example implementation of dip injection for gate drivers in one embodiment.
Figure 5C:
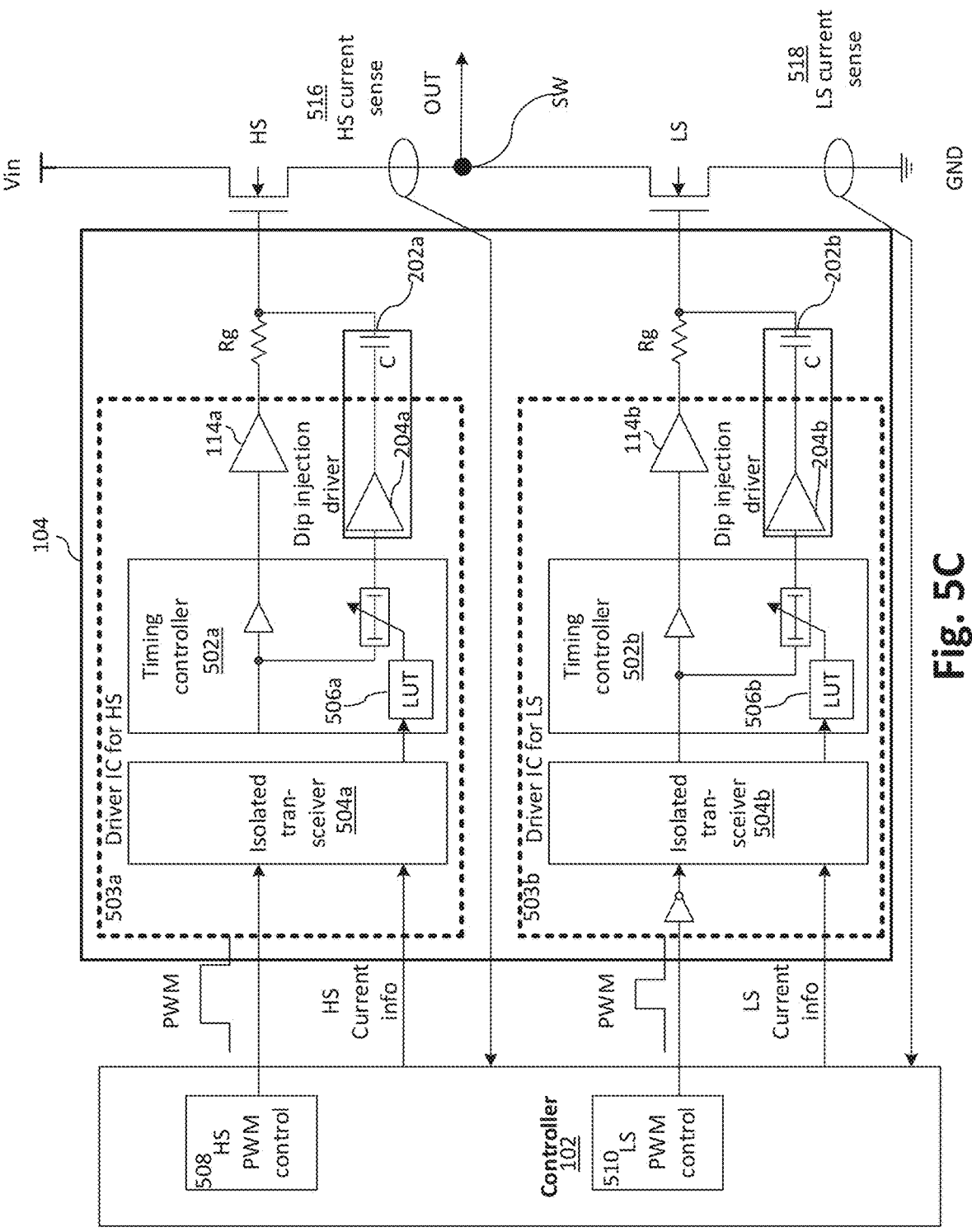
FIG. 5C is a diagram showing another example implementation of dip injection for gate drivers in one embodiment.

FIG. 5B is a diagram showing another example implementation of dip injection for gate drivers in one embodiment. In this example embodiment, controller 102 can be configured to perform functions such as HS PWM control 508 and a HS dip control 512 along with a LS PWM control 510 and LS dip control 514. Controller 102 can perform the HS PWM control function 508 and LS PWM control function 510 to provide PWM signals to the respective HS driver IC 503a and LS driver IC 503b to drive HS and LS respectively. PWM information ("PWM info") from HS PWM control 508 and LS PWM control 510 can be provided to HS dip control 512 and LS dip control 514, respectively. HS current 516 from HS to switch node SW can be sensed and fed back to controller 102. LS current 518 from LS to ground (GND) can be sensed and fed back to controller 102. Controller 102 can input HS current 516 and PWM info provided by HS PWM control 508 into HS dip control 512, and HS dip control 512 can output a dip setting 526. Controller 102 can input LS current 518 and PWM info provided by LS PWM control 510 into LS dip control 514, and LS dip control 514 can output a dip setting 528.

In one embodiment, dip settings 526, 528 can configure timing controllers 502a and 502b in the driver IC 104 to control dip injection circuit 204a, 204b respectively. By way of example, controller 102 can determine respective dip delays and send the determined dip delays as dip settings 526, 528 to timing controllers 502a, 502b, respectively. Each driver IC 104 can have two delay parameters, one for turning on the respective HS or LS switch and one for turning off the respective HS or LS switch. The dip delay can be the time from the start of a PWM signal rising or falling, to the start of the dip injection current dip. Timing controllers 502a, 502b can control dip injection circuits 202a, 202b according to the dip delays. By way of example, timing controller 502a can control dip injection circuits 202a to inject a current dip into the current driving HS at a time defined by the dip delay indicated in dip setting 526. Timing controller 502b can control dip injection circuits 202b to inject a current dip into the current driving LS at a time instance defined by the dip delay indicated in dip setting 528.

Figure 5D:
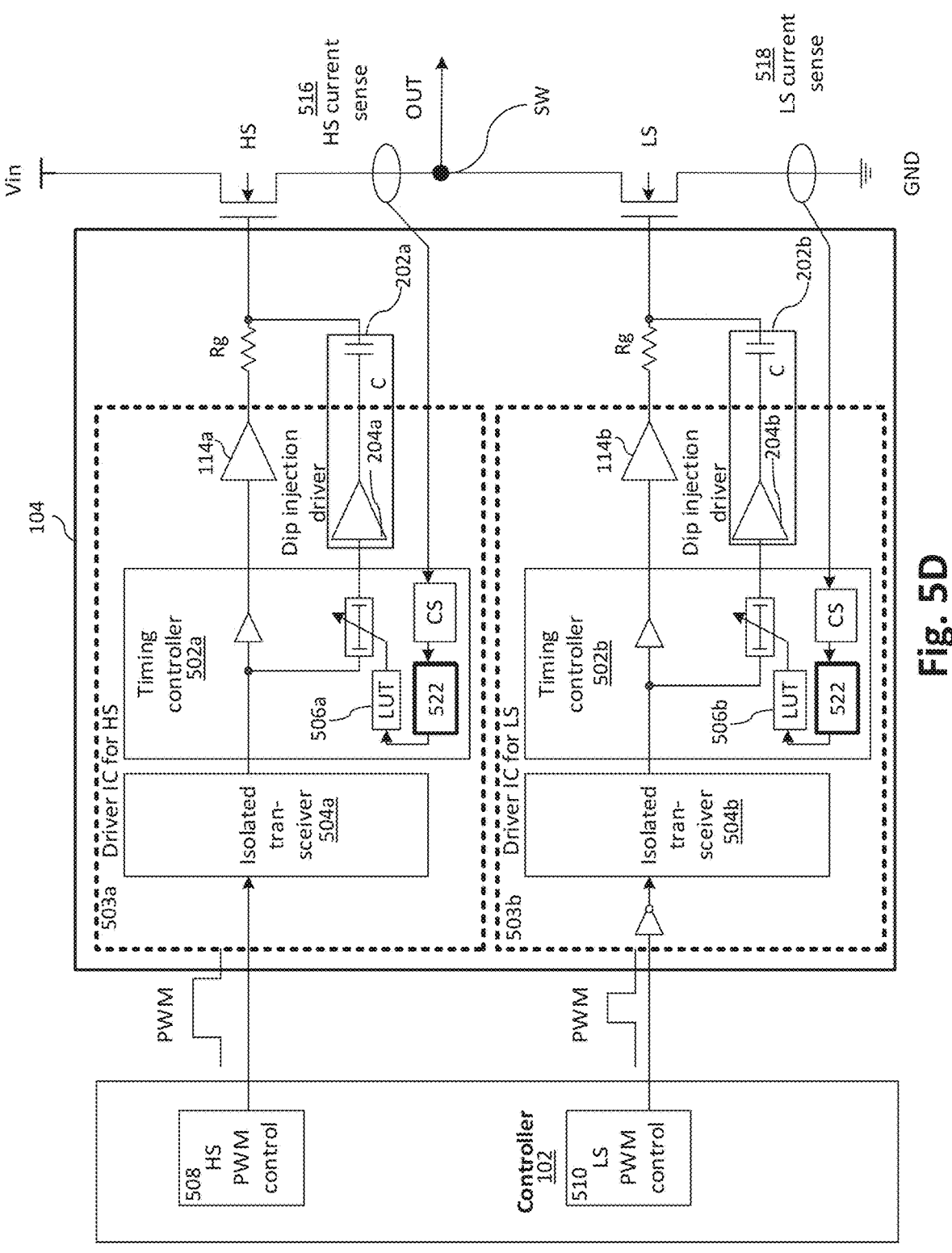
FIG. 5D is a diagram showing another example implementation of dip injection for gate drivers in one embodiment.

Table (LUT) 506a and timing controller 502b can include a LUT 506b. Each one of LUTs 506a, 506b can include mappings or associations between different current values (e.g., digital representation of amperes) and different dip delays. In response to receiving HS current 516, controller 102 can provide a digital representation of HS current 516 to LUT 506a in timing controller 502a and LUT 506a can output a dip delay that is mapped to, or associated with, HS current 516. Similarly, in response to receiving LS current 518, controller 102 can provide a digital representation of LS current 518 to LUT 506b in timing controller 502b and LUT 506b can output a dip delay that is mapped to, or associated with, LS current 518. In another embodiment shown in FIG. 5D, HS current 516 and LS current 518 can be sent directly to the driver IC 104 where an analog to digital converter (ADC) 522 can convert HS current 516 and LS current 518 into digital representations, such as digital code, that can be interpreted or read by LUTs 506a, 506b.

Figure 5E:
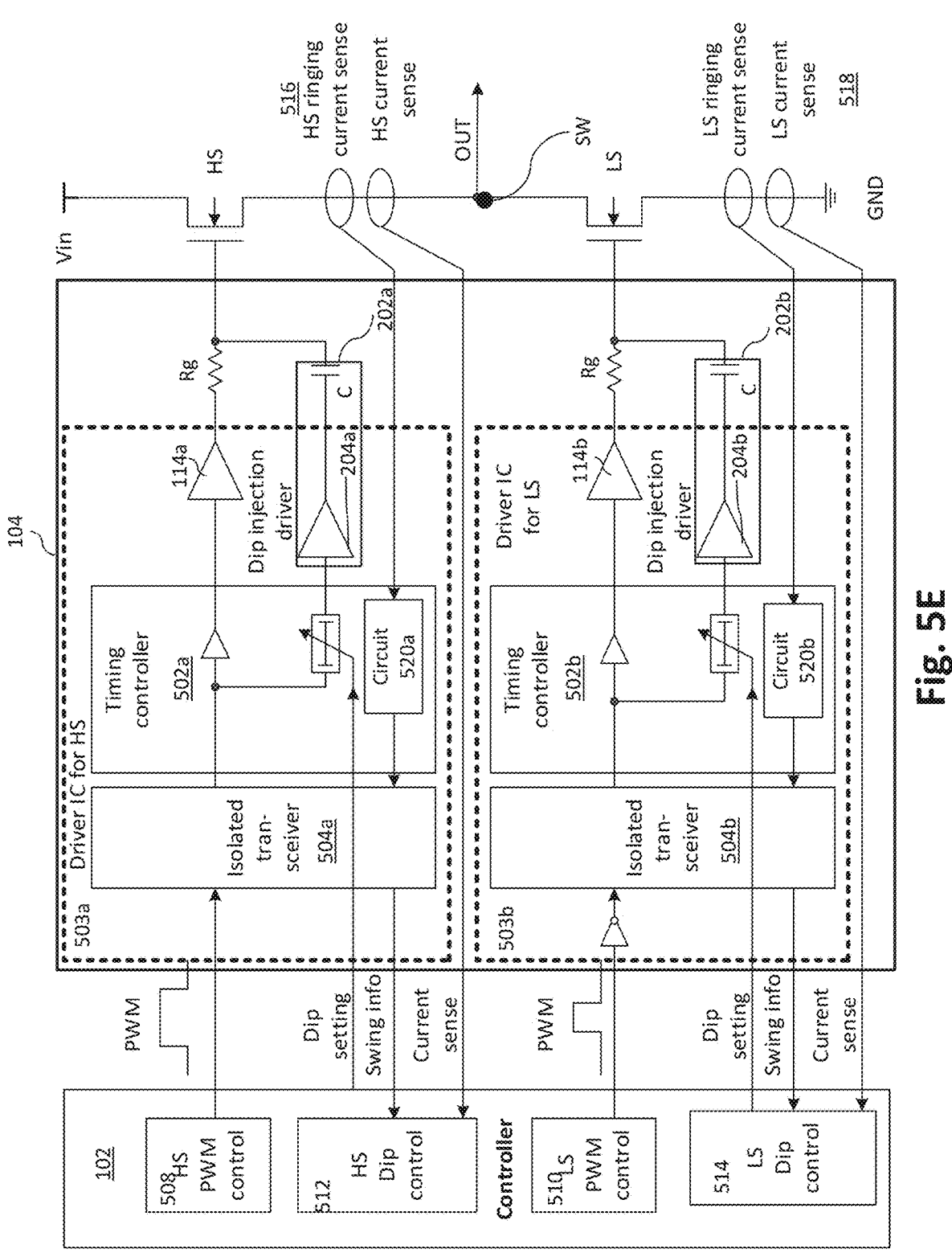
FIG. 5E is a diagram showing another example implementation of dip injection for gate drivers in one embodiment.

FIG. 5E is a diagram showing another example implementation of dip injection for gate drivers in one embodiment. In this example embodiment, swing information and current sense information (e.g., HS current 516 and LS current 518) can be sent to the controller 102 to determine an optimized dip setting. In the example shown in FIG. 5E, timing controller 502a can include a circuit 520a and timing controller 502b can include a circuit 520b. Circuits 520a, 520b can be swing detection circuits configured to detect a signal swing (e.g., a range of a signal), such as a current swing. In one embodiment, HS current 516 can be fed back to circuit 520a and circuit 520a can detect a current swing of ringing that occurs in HS current 516. Circuit 520a can send the detected current swing, such as a range of amplitudes of the ringing in HS current 516, to controller 102 as swing information ("swing info"). Controller 102 can determine dip setting 526 based on HS current 516 and the swing info provided by circuit 520a. The dip setting 526 determined based on HS current 516 and the swing info provided by circuit 520a can indicate optimized dip setting, such as a dip delay, that can minimize the current swing of ringing in HS current 516. A LS current 518 can be fed back to circuit 520b and circuit 520b can detect a current swing of ringing that occurs in LS current 518. Circuit 520b can send the detected current swing, such as a range of amplitudes of the ringing in LS current 518 to controller 102 as swing information ("swing info"). Controller 102 can determine dip setting 528 based on LS current 518 and the swing info provided by circuit 520b. The dip setting 528 determined based on LS current 518 and the swing info provided by circuit 520b can indicate optimized dip setting, such as a dip delay, that can minimize the current swing of ringing in LS current 518. The minimized current swing, or minimize the amplitudes, of ringing of HS current 516 and LS current 518 can reduce ringing at switch node SW.

Figure 5F:
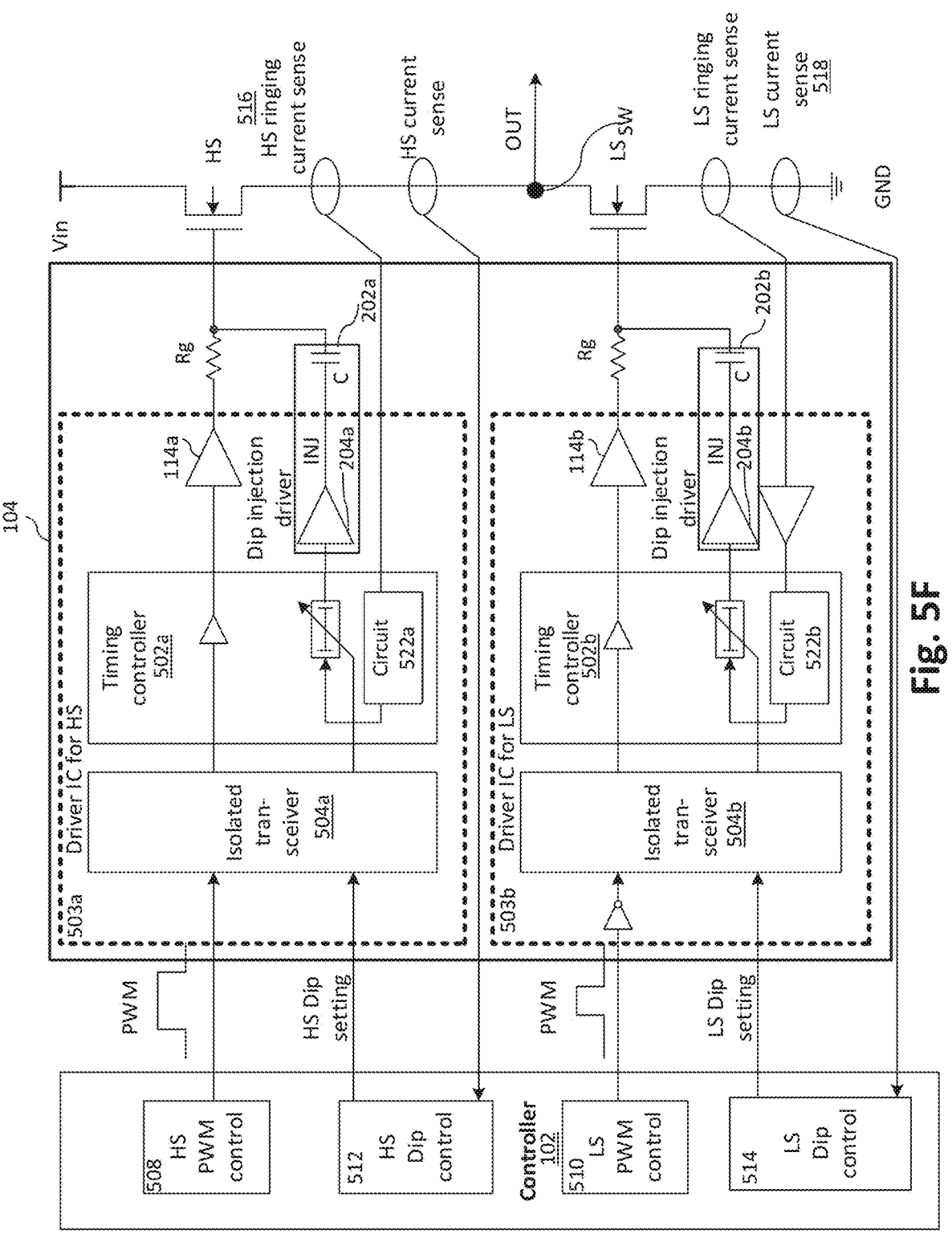
FIG. 5F is a diagram showing another example implementation of dip injection for gate drivers in one embodiment.

In another example embodiment shown in FIG. 5F, timing controller 502a can include a circuit 522a and timing controller 502b can include a circuit 522b. Circuits 522a, 522b can be ringing detection circuits configured to detect ringing timing (e.g., times in which ringing occurs) in a current signal or sensed current. In one embodiment, HS current 516 can be fed back to circuit 522a and circuit 522a can detect ringing timing in HS current 516. Timing controller 502a can use the ringing timing detected by circuit 522a and dip setting 526 (provided by controller 102) to control dip injection circuit 202a. By way of example, timing controller 502a can control dip injection circuit 202a to inject a current dip at timings that may be the same as the ringing timing detected from circuit 522a.

Figure 5G:
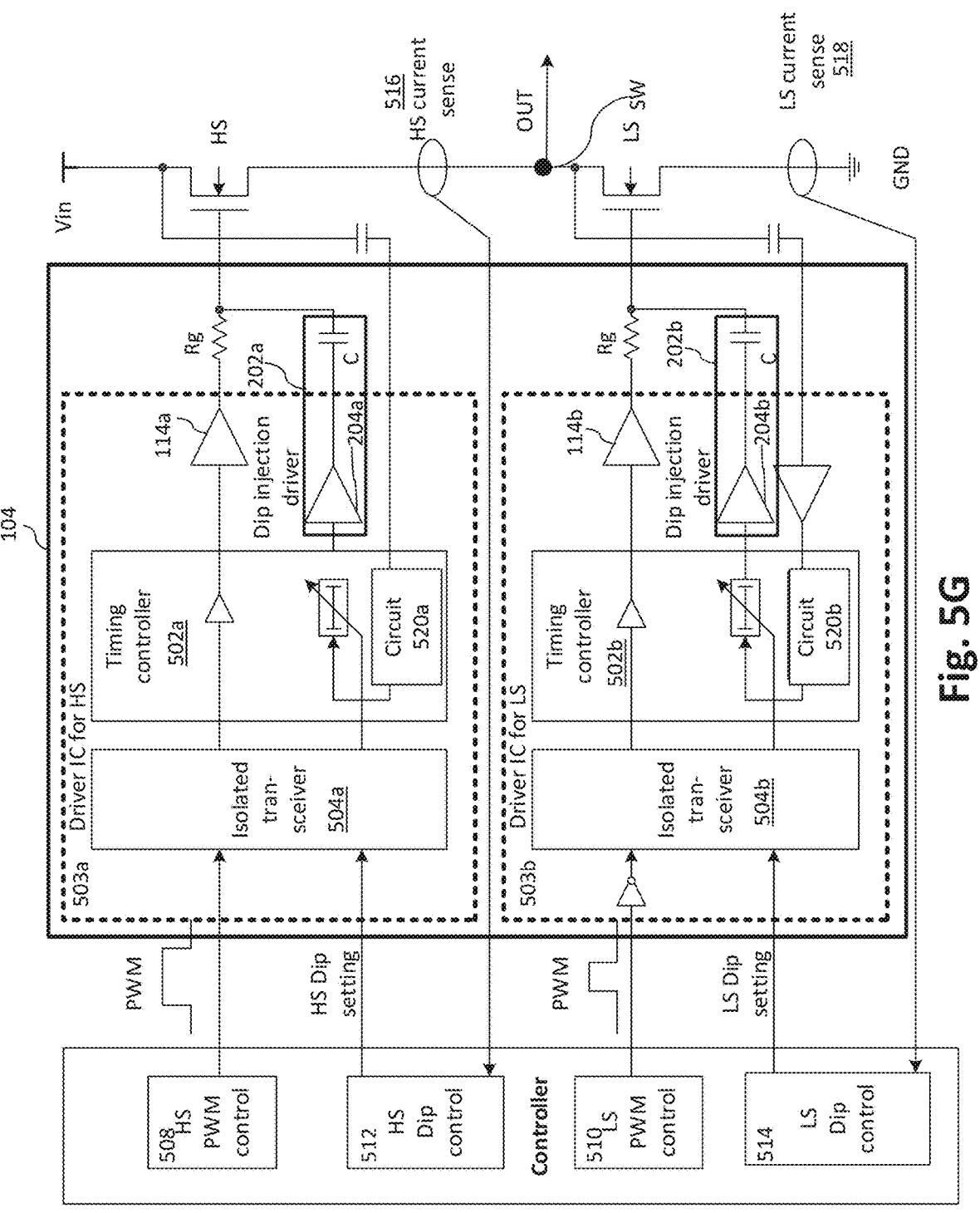
FIG. 5G is a diagram showing another example implementation of dip injection for gate drivers in one embodiment.

LS current 518 can be fed back to circuit 522b and circuit 522b can detect ringing timing in LS current 518. Timing controller 502b can use the ringing timing detected by circuit 522b and dip setting 528 (provided by controller 102) to control dip injection circuit 202b. By way of example, timing controller 502b can control dip injection circuit 202b to inject a current dip at timings that may be the same as the ringing timing detected from circuit 522b. By injecting current dip in the same times as the ringing timing detected from circuits 522a, 522b, ringing at the switch node SW can be reduced. This ringing detection generates the dip setting for the dip injection driver 202. In another embodiment shown in FIG. 5G, circuits 522a, 522b can be configured to detect voltage ringing from voltage measured between Vin and HS, and between SW and LS, respectively. The detected voltage ringing can be used for reducing ringing in a similar manner as the embodiment shown in FIG. 5F

Figure 6A:
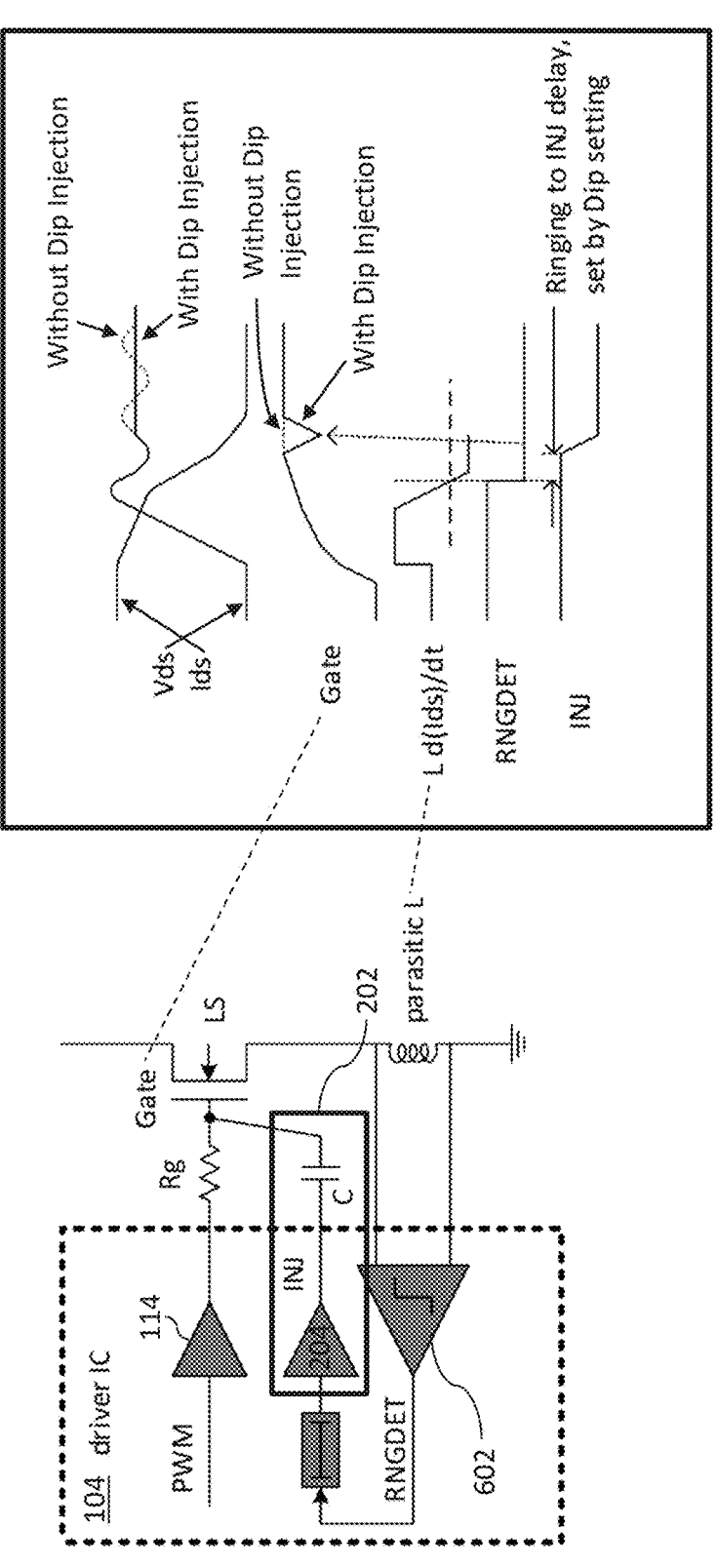
FIG. 6A is a diagram showing an impact of dip injection for gate drivers in an example implementation of the driver IC.

FIG. 6A is a diagram showing an impact of dip injection for gate drivers in an example implementation of the driver IC. In an example embodiment shown in FIG. 6A, a comparator 602 in driver IC 104, or in LS driver IC 503b, can be used for detecting ringing between LS and GND. A voltage drop across a parasitic source inductance ("parasitic L") of LS can be measured and provided to comparator 602. An output of comparator 602, labeled as RNGDET, can indicate a rate of change of current Ids passing through parasitic L since the measured voltage drop is directly proportional to the rate of change of Ids (e.g., measured voltage drop=L d(Ids)/dt)). The diagram in FIG. 6A depicts how comparator 602 detects the current ringing as the derivative of Ids, or d (Ids)/dt, becomes negative. In response to d (Ids)/dt becoming negative, RNGDET can transition from high to low, and dip injection circuit 202 can inject a current dip at a time that is delayed from the high-to-low transition of RNGDET by a dip delay defined by, for example, dip setting 528. In response to injecting a current dip, as shown in the gate current signal ("Gate"), the voltage Vds is relatively stable when compared to scenarios without dip injection.

Figure 6B:
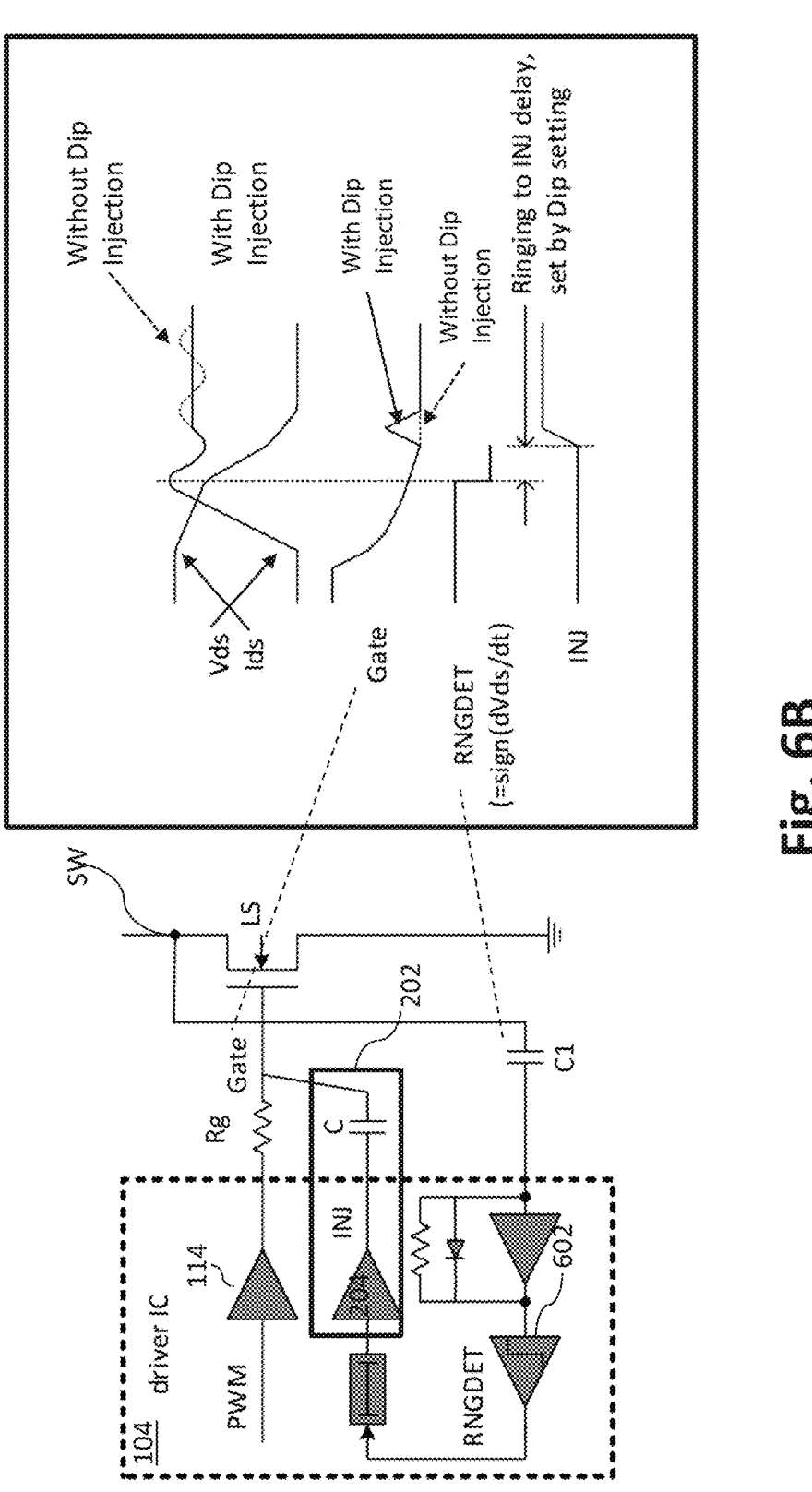
FIG. 6B is a diagram showing an impact of dip injection for gate drivers in another example implementation of the driver IC.

FIG. 6B is a diagram showing an impact of dip injection for gate drivers in an example implementation of the driver IC. In an example embodiment shown in FIG. 6B, comparator 602 in driver IC 104, or in LS driver IC 503b, can be used for detecting ringing between LS and GND. A current from switch node SW can flow through an external capacitor C1 connected to SW, and the voltage of this current can be measured and provided to comparator 602. An output of comparator 602, labeled as RNGDET, can indicate when a rate of change of voltage Vds changes from a positive rate of change to a negative rate of change (indicating a peak). The diagram in FIG. 6B depicts how comparator 602 detects the voltage ringing as the derivative of Vds, or d (Vds)/dt, where the product of the derivative of Vds and capacitance of capacitor C1 is the current measured from SW and flowing through capacitor C1. In response to d (Vds)/dt becoming 0, RNGDET can transition from high to low, and dip injection circuit 202 can inject a current dip at a time that is delayed from the high-to-low transition of RNGDET by a dip delay defined by, for example, dip setting 528. In response to injecting a current dip, as shown in the gate current signal ("Gate"), the voltage Vds is relatively stable when compared to scenarios without dip injection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
  a driver circuit configured to drive a high-side switch and a low-side switch of a switch converter; and
  a circuit configured to inject a current dip into a gate current outputted by the driver circuit to drive at least one of the high-side switch and the low-side switch,
  wherein the driver circuit comprises a timing controller configured to:
    receive a dip setting that indicate at least one parameter of the current dip; and
    control the circuit to inject the current dip in accordance with the dip setting.

2. The semiconductor device of claim 1, wherein the circuit is configured to:
  inject a first current dip into a first gate current outputted by the driver circuit to drive the high-side switch; and
  inject a second current dip into a second gate current outputted by the driver circuit to drive the low-side switch.

3. The semiconductor device of claim 1, wherein the at least one parameter comprises at least one of a dip delay.

4. The semiconductor device of claim 1, wherein the driver circuit further comprises a look-up table (LUT), and the driver circuit is configured to:
  receive sensed current associated with at least one of the high-side switch and the low-side switch;
  use the LUT to determine a dip setting of the current dip; and
  control the circuit to inject the current dip in accordance with the dip setting.

5. The semiconductor device of claim 4, wherein:
  the driver circuit further comprises an analog-to-digital converter (ADC) configured to convert the sensed current into a digital code; and
  the driver circuit is configured to input the digital code into the LUT to determine the dip setting.

6. The semiconductor device of claim 1, wherein:
  the driver circuit further comprises a swing detection circuit configured to detect swinging of ringing that occurs in sensed current associated with at least one of the high-side switch and the low-side switch;
  the driver circuit is further configured to use the detected swinging to determine a dip setting of the current dip; and
  control the circuit to inject the current dip in accordance with the dip setting.

7. The semiconductor device of claim 1, wherein:
  the driver circuit further comprises a ringing detection circuit configured to detect ringing that occurs in sensed current associated with at least one of the high-side switch and the low-side switch;
  the driver circuit is further configured to use the detected ringing to determine a dip setting of the current dip; and control the circuit to inject the current dip in accordance with the dip setting.

8. A system comprising:

a switch converter including a high-side switch and a low-side switch;

a driver circuit comprising a timing controller configured to receive a dip setting that indicates at least one parameter of a current dip, wherein the at least one parameter comprises at least a dip delay;

a controller configured to provide control signals to control the driver circuit;

the driver circuit is configured to:

drive the high-side switch and the low-side switch in the switch converter; and inject the current dip indicated by the dip setting into a gate current outputted by the driver circuit to drive at least one of the high-side switch and the low-side switch.

9. The system of claim 8, wherein the driver circuit is configured to:

inject a first current dip into a first gate current outputted by the driver circuit to drive the high-side switch; and inject a second current dip into a second gate current outputted by the driver circuit to drive the low-side switch.

10. The system of claim 8, wherein the driver circuit further comprises a look-up table (LUT), and the driver circuit is configured to:

receive sensed current associated with at least one of the high-side switch and the low-side switch;

use the LUT to determine a dip setting of the current dip; and inject the current dip in accordance with the dip setting.

11. The system of claim 8, wherein:

the driver circuit further comprises a swing detection circuit configured to detect swinging of ringing that occurs in sensed current associated with at least one of the high-side switch and the low-side switch;

the driver circuit is further configured to use the detected swinging to determine a dip setting of the current dip; and inject the current dip in accordance with the dip setting.

12. The system of claim 8, wherein:

the driver circuit further comprises a ringing detection circuit configured to detect ringing that occurs in sensed current associated with at least one of the high-side switch and the low-side switch;

the driver circuit is further configured to use the detected ringing to determine a dip setting of the current dip; and inject the current dip in accordance with the dip setting.

13. A method for operating a switch converter, the method comprising:

switching a high-side switch and a low-side switch of the switch converter; and injecting a current dip into at least one gate current being used for driving at least one of the high-side switch and the low-side switch to reduce ringing at a switch node between the high-side switch and the low-side switch, wherein the injecting the current dip into the at least one gate current comprises injecting the current dip at a specific time to reduce the at least one gate current.

14. The method of claim 13, further comprising:

detecting an occurrence of ringing at a switch node between the high-side switch and the low-side switch; and in response to detecting the occurrence of the ringing, injecting the current dip into the at least one gate current being used for driving at least one of the high-side switch and the low-side switch.

15. The method of claim 14, wherein detecting the occurrence of the ringing at the switch node comprises:

determining a frequency of a voltage at the switch node exceeds a predefined threshold; and in response to the frequency of the voltage at the switch node exceeding the predefined threshold, determining that the ringing has occurred at the switch node.

16. The method of claim 13, further comprising receiving sensed current associated with at least one of the high-side switch and the low-side switch;

using a look-up table (LUT) to determine a dip setting of the current dip; and injecting the current dip in accordance with the dip setting.

17. The method of claim 13, further comprising:

detecting at least one of:

ringing that occurs in sensed current associated with at least one of the high-side switch and the low-side switch; and swinging of the ringing that occurs in sensed current associated with at least one of the high-side switch and the low-side switch;

using at least one of the detected swinging and the detected ringing to determine a dip setting of the current dip; and injecting the current dip in accordance with the dip setting.

* * * * *